United States Patent
Davidson et al.

(10) Patent No.: US 6,671,869 B2
(45) Date of Patent: Dec. 30, 2003

(54) METHOD AND APPARATUS FOR GRAPHICALLY PROGRAMMING A PROGRAMMABLE CIRCUIT

(76) Inventors: Scott A. Davidson, 14489 Monterey Ave. South, Savage, MN (US) 55378; Steven C. Mickelson, 6809 Glenwood Ave., Golden Valley, MN (US) 55427; Gregg T. Sarkinen, 1002 Montrose Blvd., Buffalo, MN (US) 55313; Scott A. Sarkinen, 7580 Knollwood Dr., Mounds View, MN (US) 55112; Robert W. Sigel, 15625H 24th Ave. North, Plymouth, MN (US) 55447-6497

( * ) Notice: Subject to any disclaimer, the term of this patent is extended or adjusted under 35 U.S.C. 154(b) by 139 days.

(21) Appl. No.: 10/017,756

(22) Filed: Dec. 12, 2001

(65) Prior Publication Data

US 2003/0110464 A1 Jun. 12, 2003

(51) Int. Cl.⁷ ............................................ G06F 17/50
(52) U.S. Cl. ........................ 716/17; 716/16; 345/762; 345/763; 747/114; 747/136
(58) Field of Search .................. 716/1–18; 345/619, 345/650, 661, 672, 676, 689, 700, 729, 762, 763; 717/109, 113, 114, 136, 137, 144

(56) References Cited

U.S. PATENT DOCUMENTS

| | | |
|---|---|---|
| 5,168,441 A | 12/1992 | Onarheim et al. |
| 5,673,198 A * | 9/1997 | Lawman et al. ............ 364/489 |
| 5,724,074 A | 3/1998 | Chainani et al. |
| 5,852,733 A | 12/1998 | Chien et al. |
| 5,920,711 A | 7/1999 | Seawright et al. |
| 5,956,479 A | 9/1999 | McInerney et al. |
| 5,961,610 A | 10/1999 | Kelly et al. |
| 5,974,256 A | 10/1999 | Matthews et al. |

(List continued on next page.)

FOREIGN PATENT DOCUMENTS

| | | |
|---|---|---|
| EP | 1 073 310 | 1/2001 |
| WO | 99/39567 | 8/1999 |
| WO | 00/18146 | 3/2000 |
| WO | 01/03023 | 1/2001 |
| WO | 01/03374 | 1/2001 |
| WO | 01/13554 | 2/2001 |
| WO | 01/16754 | 3/2001 |

OTHER PUBLICATIONS

"Intel Delivers New Higher Performance Network Processor," Intel Corporation, Retrieved Aug. 31, 2001, http://www.intel.com/pressroom/archive/releases/in050100.htm, May 1,2002, pp. 1–2.

"IXP12DE Intel® IXP1200 Network Processor Development Environment," Intel Corporation, Product Brief, Date Unknown, 4 pgs.

(List continued on next page.)

*Primary Examiner*—Vuthe Siek

(57) ABSTRACT

A system and method for programming a programmable circuit. A graphical interface is provided to allow a user to graphically define at least one type of input data unit that is expected to be received at the programmable circuit. A visual representation of the input data format corresponding to the defined type of input data unit is presented to the user. The user graphically manipulates the visual representation of the input data format to graphically transform the input data format to a visual representation of a desired output data format of output data units to be output from the programmable circuit. Program code is automatically generated for directing the programmable circuit at run-time deployment to transform actual input data units of the defined type of input data units to actual output data units having the desired output data format in a manner corresponding to the graphical transformation of the input data format to the desired output data format.

50 Claims, 30 Drawing Sheets

U.S. PATENT DOCUMENTS

| | | | |
|---|---|---|---|
| 5,983,001 A | | 11/1999 | Boughner et al. |
| 5,999,729 A | | 12/1999 | Tabloski, Jr. et al. |
| 6,058,103 A | | 5/2000 | Henderson et al. |
| 6,112,133 A | | 8/2000 | Fishman |
| 6,172,990 B1 | | 1/2001 | Deb et al. |
| 6,208,345 B1 | * | 3/2001 | Sheard et al. ............... 345/356 |
| 6,233,726 B1 | | 5/2001 | Bowman et al. |
| 6,237,135 B1 | | 5/2001 | Timbol |
| 6,247,052 B1 | | 6/2001 | Huang et al. |
| 6,282,699 B1 | | 8/2001 | Zhang et al. |
| 6,553,550 B1 | * | 4/2003 | Menegay et al. ............... 716/6 |
| 2002/0055834 A1 | * | 5/2002 | Andrade et al. .............. 703/27 |
| 2002/0080174 A1 | * | 6/2002 | Kodosky et al. ............ 345/762 |

OTHER PUBLICATIONS

"Enhanced OS–9 For IXP1200 Data Sheet," Microware, Date Unknown, 4 pgs.

Gamma et al., "Creational Patterns," Design Patterns: Elements of Reusable Object–Oriented Software, Addison Wesley, Oct. 1994, pp. 81–136.

* cited by examiner

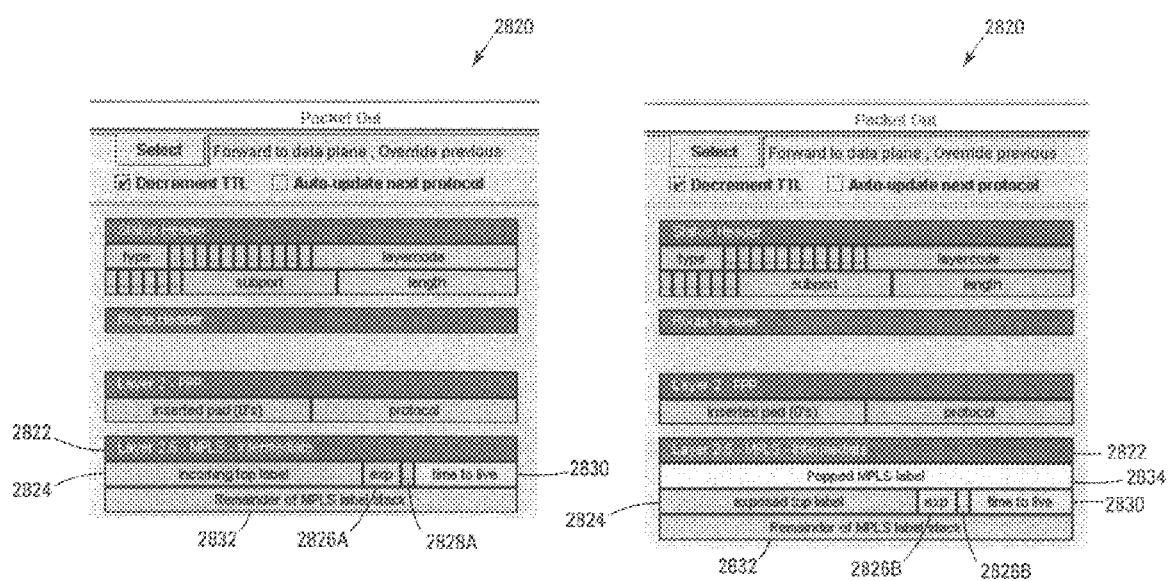
*FIG. 28B*    *FIG. 28C*

METHOD AND APPARATUS FOR GRAPHICALLY PROGRAMMING A PROGRAMMABLE CIRCUIT

FIELD OF THE INVENTION

This invention relates in general to communication networks, and more particularly to a graphical programming tool and method for generating optimized code and configuration settings for a target device, such as a programmable circuit or chip.

BACKGROUND OF THE INVENTION

In the design of electronic circuits, at least some, if not all of a circuit's functionality is often provided in the form of programmable circuits. At the high end of the programmability range are general purpose processors, which can be programmed to perform a wide range of functions in accordance with a predefined instruction set. However it is often the case that more specialized applications are required for a particular design, where a general purpose processor is ill-equipped with the requisite hardware architecture to perform the specific functions desired.

To target such situations, designers often use Application-Specific Integrated Circuits (ASIC). As its name implies, an ASIC is a custom chip designed for a specific application. ASICs may be designed such that they can be configured to some extent at run-time deployment of the chip. ASICs are generally considered for a very specific use, and are often not intended as a commodity item that can be used by multiple customers for multiple uses.

Other programmable circuits may include some of the programmability characteristics of general purpose processors, yet also include specific hardware directed to a more particular use. These special purpose circuits and/or chips require some level of programming to cause the device to operate in the desired fashion. For example, an Application-Specific Standard Processor (ASSP) is an example of a programmable circuit, but has a specific hardware architecture to accommodate a particular design purpose. These and other types of special-purpose programmable devices are generally designed for use in a particular piece of equipment, but are intended for sale and use by multiple vendors.

One disadvantage of such a special-purpose, programmable device is that developers who want to use the device in a system design have conventionally been forced to become intimately familiar with the hardware architecture and programming language associated with the device. For example, if a developer wanted to program a programmable network processor, the developer would study the architecture and data sheets associated with the particular device. The developer would need to do this in order to become knowledgeable enough to know how to program the device. Further, the programmable device may require programming via a special or proprietary programming language, thereby requiring the developer to learn a new programming language. From all of this new knowledge, the developer formulates the programming code that will be used by the device in performing the operations desired of that device for its particular application. When that process is complete, the developer performs simulations and other testing in order to properly debug the code that has been prepared. Often times many iterations of this process are required to obtain the performance objectives.

Although this painstaking approach can ultimately result in a device that is adequately programmed to carry out the desired functions, it takes a great deal of time for developers to learn the intricate architectural details of the device, program the device, and test the device. Where the device is to be used in a marketable design or system, this significantly, and adversely impacts the speed at which the design or system can reach the market. Furthermore, it is highly unlikely that the programming code will be generated in such a way as to optimize performance of the programmable device.

Accordingly, there is a need to facilitate the programming of such programmable circuits, in order to alleviate the burden and time commitment facing developers. The present invention provides a solution to the aforementioned and other shortcomings of the prior art, and provides a variety of significant advantages over prior art programming methodologies.

SUMMARY OF THE INVENTION

To overcome limitations in the prior art described above, and to overcome other limitations that will become apparent upon reading and understanding the present specification, the present invention discloses a graphical programming tool and method for generating optimized code and configuration settings for a target device, such as a programmable circuit or chip. One aspect of the invention provides for real-time performance and validity feedback in order to optimize the programming code and/or configuration settings. The invention allows the low level functionality of the target device to be abstracted into high-level application definitions, where the developer uses a Graphical Programming Interface (GPI) to control the operations of the target device, including data input, processing, data output, and dependent peripheral devices.

In accordance with one embodiment of the invention, a method is provided for programming a programmable circuit. The method includes providing an interface for allowing a user to graphically define at least one type of input data unit that is expected to be received at the programmable circuit. A visual representation of the input data format corresponding to the defined type of input data unit is presented to the user. The user is allowed to graphically manipulate the visual representation of the input data format to graphically transform the input data format to a visual representation of a desired output data format of output data units to be output from the programmable circuit. Program code is automatically generated for directing the programmable circuit at run-time deployment to transform actual input data units of the defined type of input data units to actual output data units having the desired output data format in a manner corresponding to the graphical transformation of the visual representations of the input data format to the desired output data format.

In accordance with another embodiment of the invention, a method for programming a programmable circuit is provided, where a visual representation of at least one expected data protocol format for data packets that will be input to the programmable circuit is displayed. A graphical user interface is provided to allow a user to graphically edit one or more data fields associated with the visual representation of the expected data protocol format to produce a visual representation of a desired data protocol format for transformed data packets that are to be output from the programmable circuit. Program code is automatically generated for use by the programmable circuit to transform the data packets that are received at the programmable circuit to the transformed data packets that are output from the programmable circuit. The resulting transformation of the data packets at the programmable circuit corresponds to the graphical transformation effected via the graphical user interface.

In accordance with another embodiment of the invention, a graphical programming tool for generating program code operable on a programmable circuit having a circuit programming interface is provided. The graphical programming tool includes a graphical user interface to display a visual representation of at least one expected data protocol format for data packets that will be input to the programmable circuit. The graphical user interface further allows the user to graphically edit one or more data fields associated with the visual representation of the expected data protocol format to produce a visual representation of a desired data protocol format for transformed data packets that are to be output from the programmable circuit. A processor is configured to automatically generate program code for use by the programmable circuit to transform the data packets that are received at the programmable circuit to the transformed data packets that are output from the programmable circuit. The resulting transformation of the data packets at the programmable circuit corresponds to the graphical transformation effected via the graphical user interface. A programming tool interface is coupled to the circuit programming interface to provide the generated program code to the programmable circuit.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described particular examples of embodiments in accordance with the invention.

BRIEF DESCRIPTION OF THE DRAWINGS

The invention is described in connection with the embodiments illustrated in the following diagrams.

FIGS. 28A, 28B, and 28C illustrate an exemplary manner in which packet modifications can be effected;

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized, as structural and operational changes may be made without departing from the scope of the present invention.

Generally, the present invention is a graphical programming tool capable of generating optimized code and configuration settings for a target device, such as a programmable circuit or chip. The tool provides for real-time performance and validity feedback in order to optimize the programming code and/or configuration settings. The invention allows the low level functionality of the target device to be abstracted into high-level application definitions, where the developer uses a Graphical Programming Interface (GPI) to control the operations of the target device, including data input, processing, data output, and dependent peripheral devices. In one embodiment, the tool allows a developer to identify the expected data format of the data input to the target device, and to define the desired data output format from the target device. From these endpoint or "interface" definitions, the tool automatically generates the program code and/or configuration settings that can be downloaded to the target device. When loaded with the generated program code and/or configuration settings, the target device effects the operations and translations of the input data format to the output data format during actual run-time of the target device. In this manner, a developer implementing the target device is relieved from the need to understand the intricacies of the target device itself. Rather, the developer need only identify the input data format and corresponding data fields of interest, manipulate visual representations of the data as it is processed by the target device, and define the desired modifications to these identified data fields to produce the desired output data format.

Figure 1:
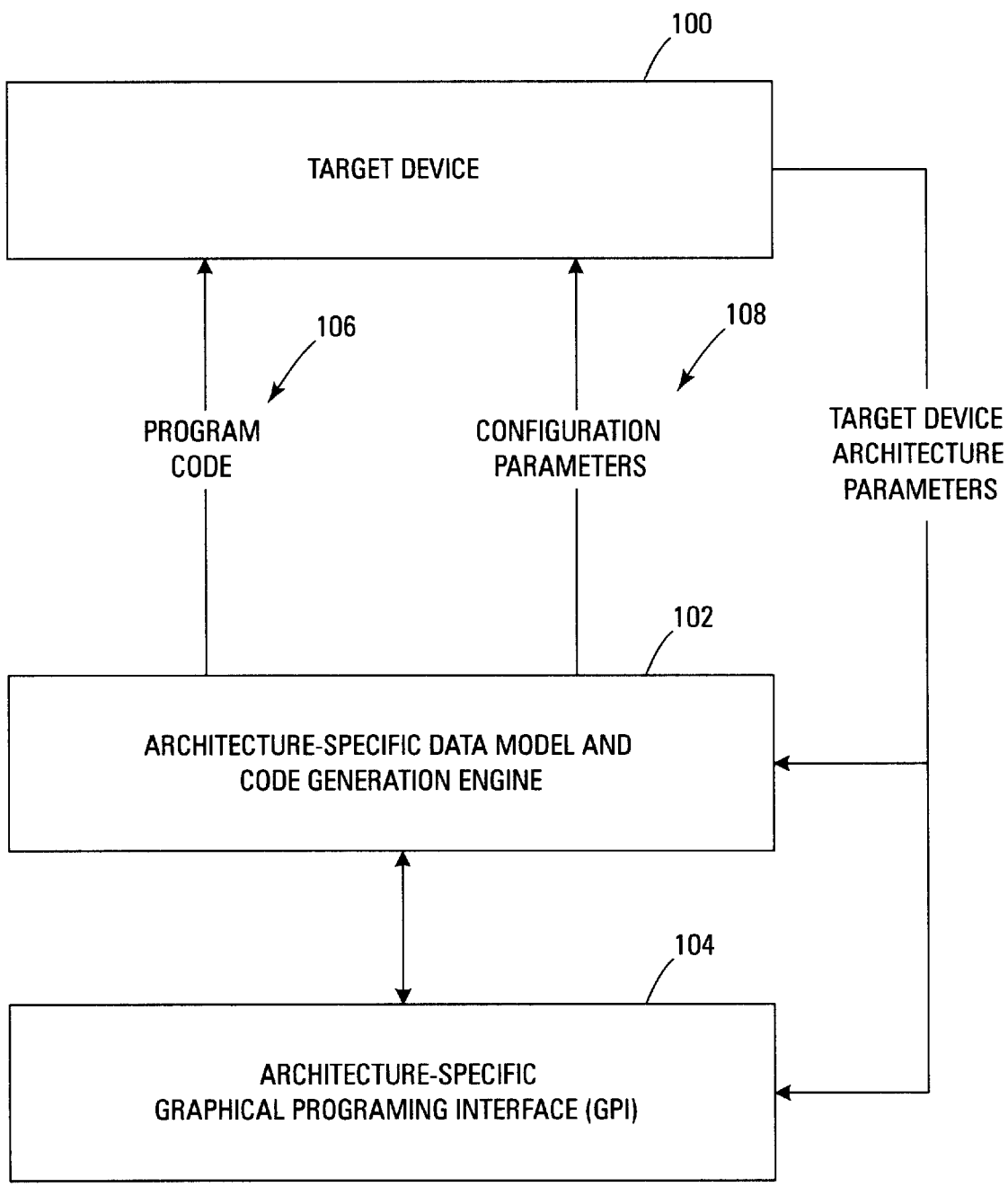
FIG. 1 is a block diagram illustrating one embodiment of a circuit programming tool in accordance with the invention.

FIG. 1 is a block diagram illustrating one embodiment of a circuit programming tool in accordance with the invention. The target device 100 represents a circuit that is to be programmed with programming code and/or configuration settings. The target device 100 may be, for example, a programmable Application-Specific Integrated Circuit (ASIC), Application Specific Standard Processor (ASSP), or a suite of components providing a programmable circuit. In the prior art, if such a target device 100 were to be programmed prior to its use, a developer would study the architecture and data sheets associated with the device. Furthermore, the programmer may need to learn a new programming language, particularly where the target device is to be programmed using a proprietary programming language developed for the device. From this information, the developer would then formulate the programming code that will be used by the device 100 in performing the operations desired of that device for its particular application. When that process was complete, the developer would then begin simulations and other testing in order to properly debug the code that had been prepared. Often times many iterations of this process are required to obtain the performance objectives. Although this painstaking approach can ultimately result in a device that is adequately programmed to carry out the desired functions, it takes a great deal of time for developers to learn the intricate details of the device, program the device, and test the device. Where the device is to be used in a marketable design or system, this significantly, and adversely, impacts the speed at which the design or system can reach the market. Furthermore, it is highly unlikely that the programming code will be generated in such a way as to optimize performance of the programmable device 100.

The system of FIG. 1 allows the low level functionality of the target device 100 to be abstracted into high-level application definitions, thereby alleviating the need for the developer to fully understand the architecture of the device, manually generate programming code, or simulate the device 100. This is accomplished through the architecture-specific data model and code generation engine 102, and the architecture-specific Graphical Programming Interface (GPI) 104. The GPI is a Graphical User Interface (GUI)-based program that, together with the code generation engine 102, facilitates the generation of the microcode and configuration for programming the target device. Because in one embodiment of the invention the GPI serves as the GUI, the terms GPI and GUI may be used interchangeably herein.

Target device architecture parameters are abstracted from the target device 100, and used in the creation of the data model/code generation engine 102 and GPI 104. The GPI 104 provides the user interface to the developer, and the data model/code generation engine 102 bridges the user input and the resulting program code 106, configuration parameters 108, and/or any other data that may be used to prepare the target device 100 for operational use. The program code may be generated by creating original program code, i.e., creating each line of code "from scratch." Alternatively, program code may be generated by selecting one or more predefined software modules from a software module library. In another embodiment, the program code is generated through a combination of the creation of original program code, along with selecting one or more predefined software modules.

Application Programming Interfaces (APIs) may be used in connection with the GPI. As is known in the art, an API is a series of functions that programs can use to make the target device perform certain tasks. The APIs associated with the GPI 104 of the present invention may be used to abstract run-time functionality into system calls to compile the GPI 104 information into code for ultimate downloading and updating of the target device 100 at run-time.

Figure 2:
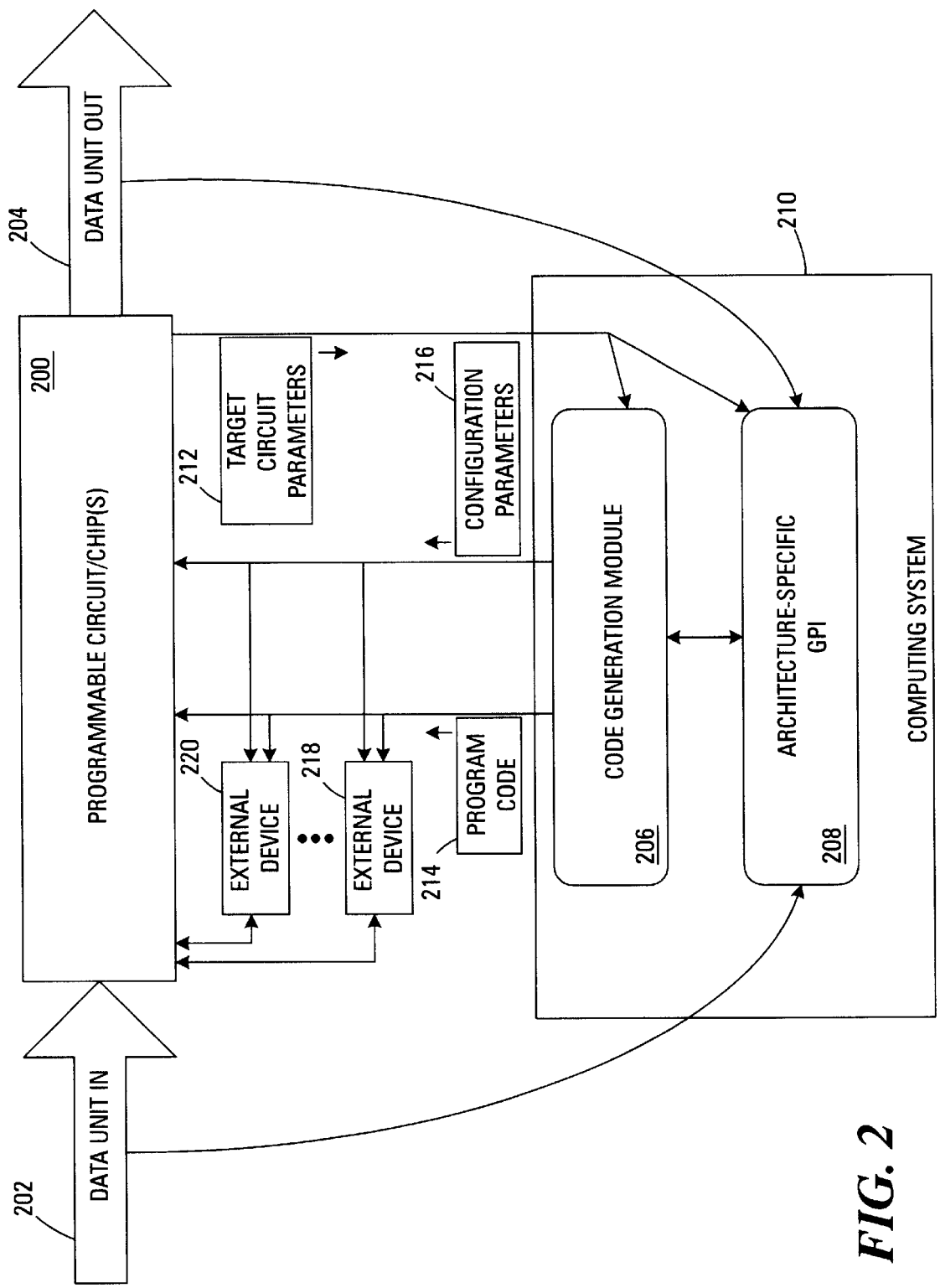
FIG. 2 is a block diagram of a more particular environment employing the principles of the present invention.

FIG. 2 is a block diagram of a more particular environment employing the principles of the present invention. A programmable circuit/chip(s) 200 represents the circuit that is to be programmed and/or configured. For purposes of simplicity, the programmable circuit or chip(s) will be referred to as a programmable chip in connection with this description, although it may include multiple components. When properly programmed and configured, the illustrated chip 200 will receive data units, as represented by the input arrow 202. These data units may include, for example, data packets, frames, cells, or other data representations. The purpose of this exemplary chip 200 is to receive this input data, edit the data in a desired manner, and output modified data units as represented by the output arrow 204. However, the programmable chip 200 must be programmed so that the chip 200 performs the functions and generates the desired output data result for the particular design application being implemented. As previously indicated, traditional methods of effecting such a result would include manually programming the chip 200 through gaining a full understanding of the chip architecture, and of the programming language associated with the chip, which may be a proprietary programming language. Simulation and other testing would also be necessary to ensure that the device was programmed properly.

In accordance with the invention, a code generation module 206 and associated GPI 208 are executed on a computing system 210, which may include one or more computing devices. The GPI 208 (including the GUI) allows the developer to identify the data format(s) expected to be input 202 to the chip 200, and to define the desired data format(s) to be output 204. The GPI 208 provides a visual tool for the developer to actually visualize the data as it is processed by the chip 200, thereby allowing the developer to program the chip 200 at the application (i.e., data unit) level. The GPI is developed taking into consideration various circuit/chip parameters 212, which results in the proper presentation and selectable options for the developer. A variety of user interface options, described in greater detail below, are provided by the GPI 208 to allow the developer to effect this high-level, visual programming.

The code generation module 206 recognizes the information input via the GPI 208. The code generation module 206 takes into account the internal data model defined by the various circuit/chip parameters 212. The GPI 208 operates to process the GPI 208 inputs at the chip architectural level, which allows the GPI 208 to operate at a higher level of abstraction. Based on the GPI 208 input, and processing this information in view of the chip architectural information known to the GPI 208, the code generation module 206 can generate the actual program code 214 and/or configuration settings 216 that will cause the chip 200 to modify the input data units 202 to create the desired output data units 204. It should be noted that the code generation module 206 and GPI 208 are illustrated as discrete modules for purposes of illustration, however the code generation module may be integral to the GPI.

Various devices accompanying the chip 200 may also be programmed by the system 210, such as the external devices 218, 220. In another embodiment, the external devices may not be directly programmed by the system 210, but rather may be identified through the GPI 208 in order to facilitate programming of the chip 200. For example, one or more of the external devices 218 through 220 may represent data memories, content-addressable memories (CAM), or other memory devices. The type, size, technology, or other memory parameters may be entered via the GPI 208, where these parameters affect the programming of the chip 200 itself. As a more particular example, an external memory device 218, 220 may be identified via the GUI 208 as being a 36-bit wide, 1K Static Random Access Memory (SRAM). This information may then be used in the programming of the chip 200, even though the devices 218, 220 are not directly programmed by the system 210. When utilizing the chip 200 during actual run-time, the 32-bit wide, 1K SRAM would then be implemented, and the chip 200 would be properly programmed to operate with the memory chip.

A variety of different programmable circuits/chips may be programmed in accordance with the principles of the present invention. In order to facilitate an understanding of more particular operational aspects and features of the invention, a more particular example is described below. The below description thus provides a representative, more specific example of graphical programming tool in accordance with the invention, and the manner in which it generates programming code and configuration parameters for a particular type of processor. From the description provided below, it will be readily apparent to those of ordinary skill in the art that the invention is equally applicable to other programmable chips and circuits. Therefore, the ensuing description is intended to facilitate an understanding of the invention, and the invention is clearly not limited to the particular embodiments illustrated below.

One representative system in which one or more processors may require programming in accordance with the invention is a network switching or routing system. For example, any of the network processors may require programming, such as an ingress processor, egress processor, fabric interface processor, etc. In order to provide an understanding of the illustrated embodiments below, a representative network router is first briefly described, where one of the chips associated with the network router is the subject of the exemplary embodiments described below.

Figure 3:
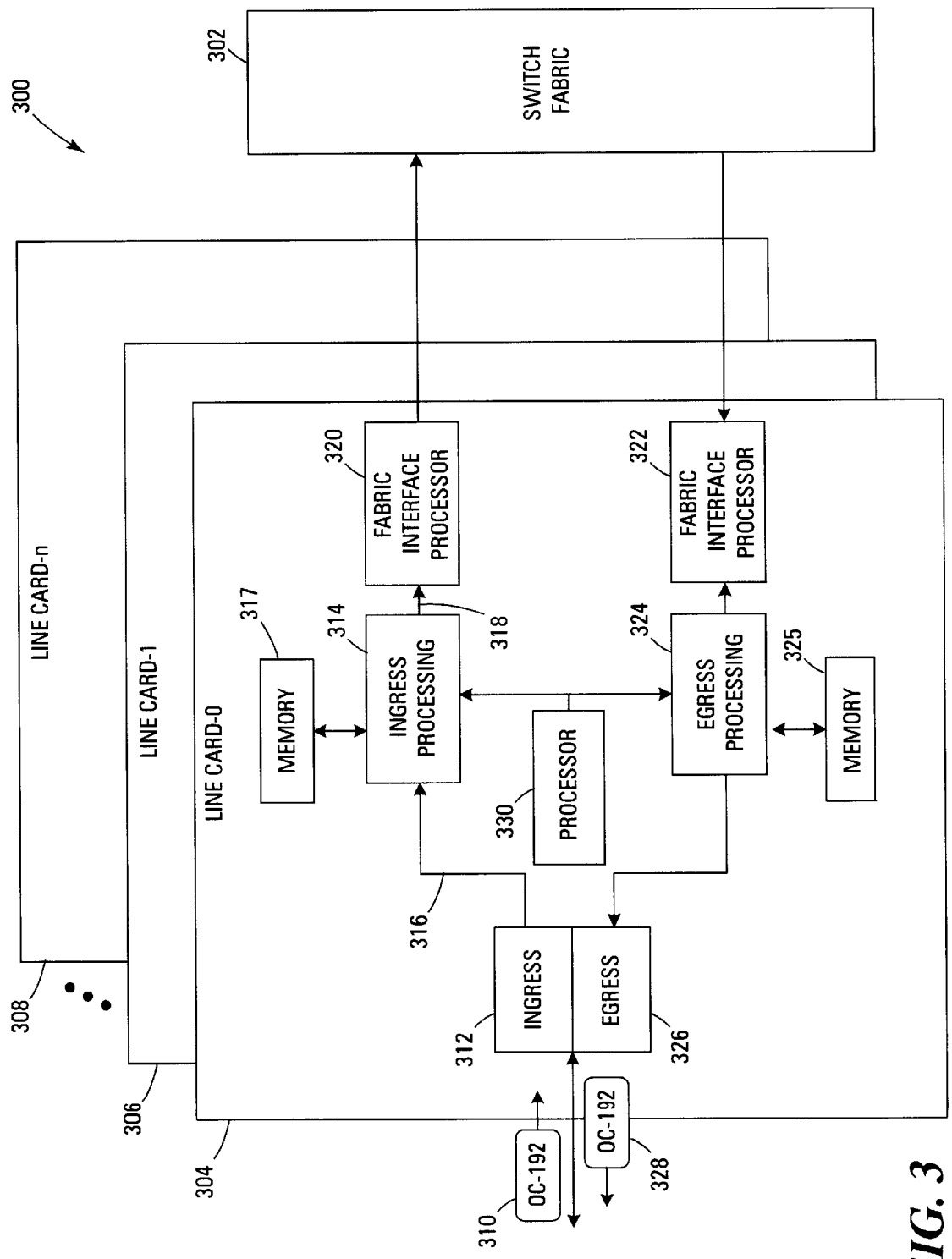
FIG. 3 illustrates a representative router system in which the principles of the present invention may be applied.

Referring now to FIG. 3, a representative router system 300 is illustrated in which the principles of the present invention may be applied. In this example, one or more line cards are provided, each of which are coupled to a switch fabric 302. In the present example, a plurality of line cards are provided, including line card-0 304, line card-1 306 through a finite number of line cards represented by line card-n 308.

Each line card of the router 300 receives data that can ultimately be processed and further routed. For example, the line card-0 304 of the illustrated embodiment receives as input packet-over-SONET/SDH (POS) frames from the network. As is known in the art, SONET/SDH is a high-speed time division multiplexing (TDM) physical-layer transport technology. Incoming POS OC-192 frames 310 originate from another OC-192 device (not shown) and arrive at the line card-0 304 at the ingress framer 312. The frames are transferred to the ingress processing circuit 314 via an interface 316, such as the Optical Internetworking Forum (OIF) System Packet Interface-4 (SPI-4). OIF SPI-4 describes a data path interface between the physical and link layers to support physical line data rates up to 10 Gb/s, and may be used in connection with the present invention, as may other interfaces.

The ingress processor 314 is a programmable device, and is the subject of the exemplary embodiment of the graphical programming tool described more fully below. In one embodiment, the ingress processor 314 is housed in a single chip, and performs the necessary lookups, policing, and editing of the packet. One or more CAMs, SRAMs, or other memories 317 may be used in connection with the ingress processor 314. The frames are fed out of the ingress processing circuit 314 via an OIF SPI-4 interface 318 to a fabric interface processor 320. The fabric interface processor 320 converts the stream from one format to another, such as from POS frames to Common Switch Interface (CSIX) cells, and distributes the cells over the switch fabric 302.

Similarly, cells switched at the switch fabric 302 may be received at the fabric interface processor 322 and provided to the egress processing circuit 324. Frames are transferred to the egress framer 326, and output as POS OC-192 frames 328. One or more CAMs, SRAMs, or other memories 325 may be used in connection with the egress processor 324.

The processor 330 represents an example of a computing system in which the graphical programming tool in accordance with the present invention may be implemented. For example, the computing system 210 shown in FIG. 2 may be utilized as the processor 330 to facilitate programming of circuits, such as the ingress processor 314 and the egress processor 324. The various embodiments of the invention described below are described in connection with an exemplary ingress processor.

Figure 4:
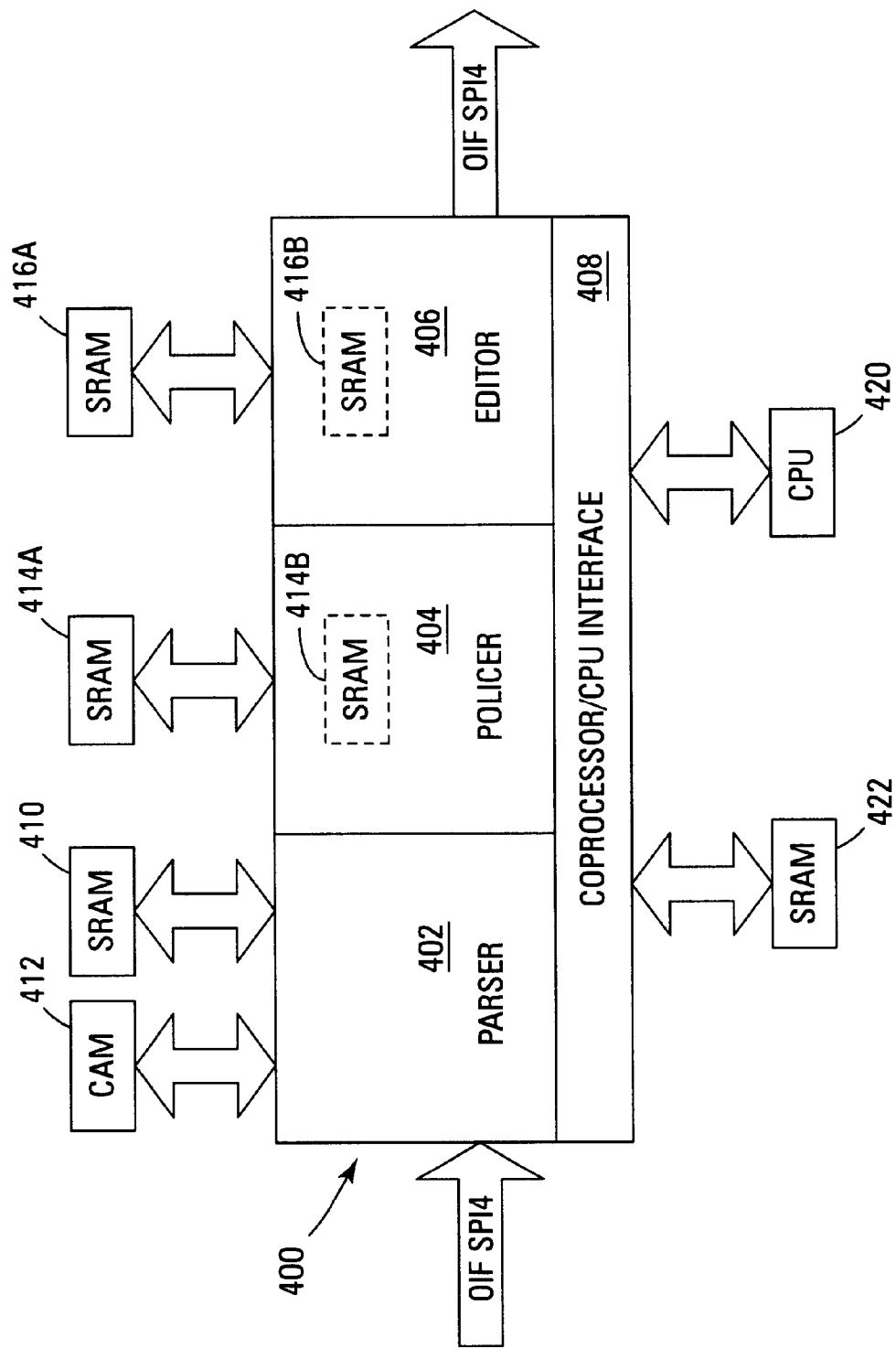
FIG. 4 is a block diagram illustrating selected functional blocks of an exemplary programmable ingress processing system.

FIG. 4 is a block diagram illustrating selected functional blocks of an ingress processing system such as that described in connection with FIG. 3. The ingress processor 400 illustrates the parser functional block 402, the policer functional block 404, and the editor functional block 406. The parser 402 builds queries (search words) to directly index a memory such as SRAM 410, or alternatively may search against a CAM 412 which in turn provides addresses to the SRAM 410. The policer 404 performs a variety of functions, including ensuring flow conformance to a maximum allowed peak rate and a contractually obliged committed rate flow, utilizing, for example, DiffServ IP and MPLS. The policer 404 works with memory(s), such as SRAM 414A which stores a drop policy for each connection. The memory may also be embedded into the policer 404, as shown by embedded SRAM 414B.

The editor 406 supports policing results and makes other appropriate modifications to the packet before being output from the ingress processing system 400. An external memory, such as SRAM 416A, may be used to store the editor instructions that are generated by the graphical programming tool of the present invention. The memory may also be embedded into the editor 406, as shown by embedded SRAM 416B. The coprocessor/CPU interface 408 provides for coprocessor/CPU support via interface 408, thereby allowing processor control, configuration, etc. of the parser 402, policer 404 and editor 406 via the programming tool of the present invention. The interface 408 allows the system 400 to be coupled to a coprocessor and/or other CPU such as CPU 420, and to memory such as SRAM 422. When programmed in accordance with the invention, the ingress processing system 400 receives incoming packets, classifies and parses the packets according to user-defined criteria such as protocol, enforces policing functions on the packets, and modifies the packets accordingly before outputting the packets to the switch fabric.

The exemplary classifier/parser, policer, and editor modules described in connection with FIG. 4 are described in greater detail in various copending U.S. patent applications that are assigned to the assignee of the instant application. These copending U.S. patent applications include, Ser. No. 09/849,804 entitled "System And Method For Providing Transformation Of Multi-Protocol Packets In A Data Stream," filed on May 4, 2001, U.S. patent application Ser. No. 09/849,913 entitled "A Method And Apparatus For Providing Multi-Protocol, Multi-Stage, Real-Time Frame Classification," filed on May 4, 2001, U.S. patent application Ser. No. 09/849,914 entitled "System And Method For Policing Multiple Data Flows And Multi-Protocol Data Flows," filed on May 4, 2001, and U.S. patent application Ser. No. 09/849,810 entitled "System And Method For Hierarchical Policing Of Flows And Subflows Of A Data Stream," filed on May 4, 2001, the contents of which are incorporated herein by reference.

Figure 5:
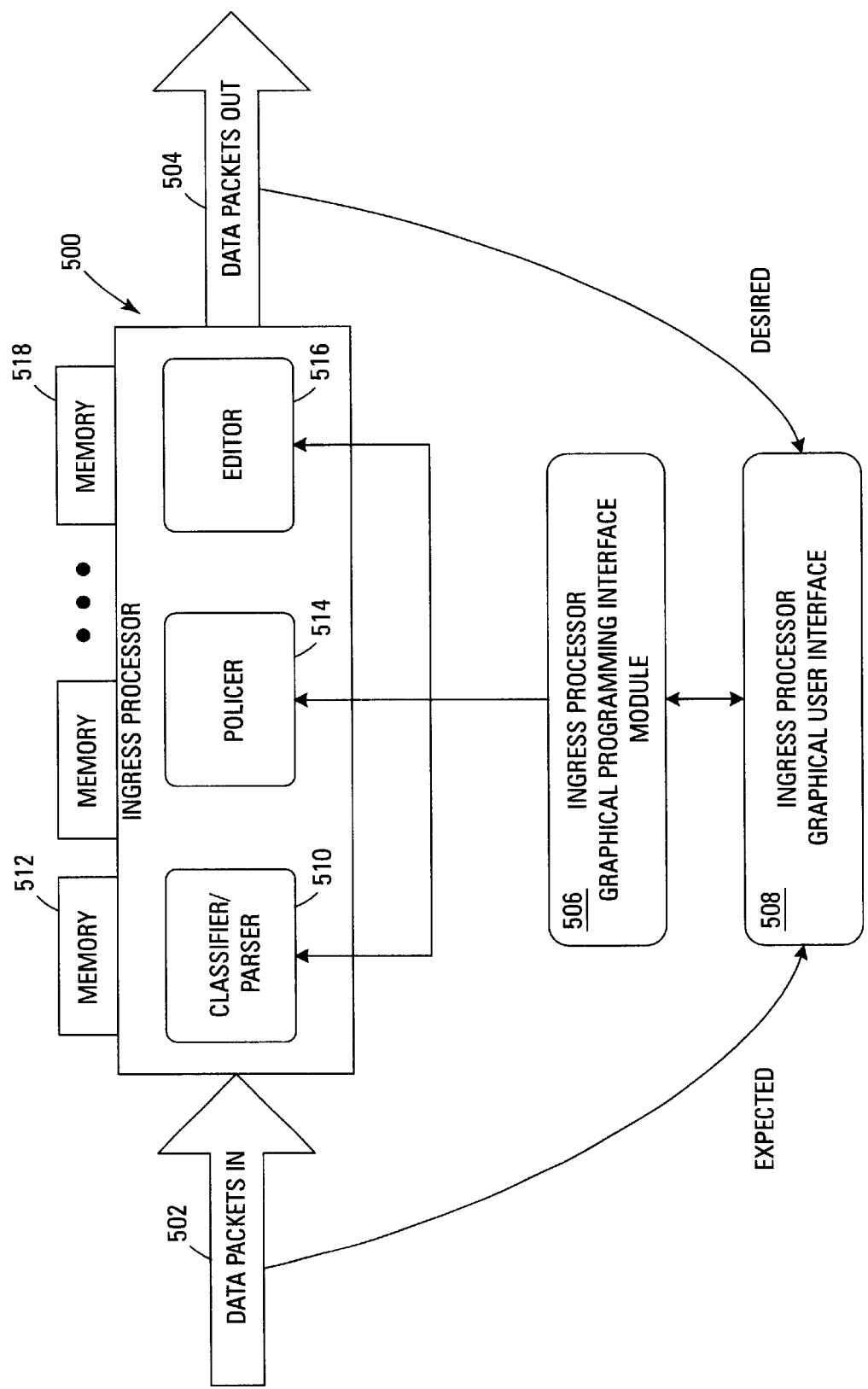
FIG. 5 is a block diagram illustrating the manner in which a network processor, such as an ingress processor, may be programmed using the graphical programming tool of the present invention.

FIG. 5 is a block diagram illustrating the manner in which a network processor, such as an ingress processor, may be programmed using the graphical programming tool of the present invention. The representative programmable chip in the example of FIG. 5 is the ingress network processor 500 described above, which represents the circuit that is to be programmed and/or configured. When properly programmed and configured, the ingress processor 500 will receive data packets (or cells, frames, etc.), as represented by the input arrow 502. After parsing, policing, and editing, the ingress processor 500 outputs modified data packets as represented by the output arrow 504.

The illustrated embodiments of the present invention describe the code generation and GPI modules used to generate the programming code and associated configuration settings for the ingress processor 500 and dependent peripheral chips. The ingress processor 500 is a highly programmable chip, and therefore provides a wide range of programming options. For example, network system developer may choose to use an ingress processor 500 to build a network router to perform Internet Protocol (IP) routing. However, the programmable ingress processor 500 is capable of handling many different protocols of different layers. Layer-2 protocols may include, for example, point-to-point protocol (PPP), Framed ATM over SONET/SDH Transport (FAST), and various Ethernet protocols. Multiprotocol Label Switching (MPLS) integrates layer-2 information about network links into layer-3 (i.e., IP) within a particular autonomous system in order to simplify and improve IP-packet exchange. MPLS essentially provides connection-oriented labeling in an otherwise connectionless environment, which has resulted in MPLS being considered associated with layer-2.5. Layer-3 protocols may include the Internet Protocol version-4 (IPv4), and the Internet Protocol version-6 (IPv6). Layer-4 protocols include User Datagram Protocol (UDP), Transmission Control Protocol (TCP), Internet Control Message Protocol (ICMP), Internet Group Management Protocol (IGMP), and others.

The developer who is building the network router will know the particular format of the data to be received at the ingress processor 500. For example, the data packets 502 may be received with layers 2–4 having a format of PPP/MPLS/IPv4/TCP. The data packet format(s) expected to be the input to the ingress processor 500 can be entered by the developer via the GPI 508. In this manner, the developer identifies a first "endpoint" or "interface" of the data stream to facilitate generation of resulting programming code at the code generation module 506 (which may be integral to the GPI). The developer can then visually identify data fields of interest among the protocol headers of the various layers. These identified fields are used to generate search words at the classifier/parser 510 that will index one or more memories at run-time, which are further used by the ingress processor 500 as described more fully below. The memory 512 represents such a memory, such as an SRAM, CAM, etc. The GPI 508 and code generation module 506 automatically generate the program code used to access the memory device 512 in the appropriate manner, and at the appropriate time. The developer therefore visually programs the parser 510 of the ingress processor 500 at the packet level, without the need for knowledge of the underlying ingress processor architecture.

In accordance with the invention, the developer will also be able to view policer 514 parameters, including setup parameters and bandwidth utilization. The user can select policer configuration parameters via the GPI 508. Further, the identification of the data packet formats at the parser 510 allows the GPI 508 to present representations of the packet headers that are input into the parser 510. The developer can view these packet header representations, and graphically "edit" or otherwise transform and process the packets via the GPI 508, ultimately generating program code and/or configuration settings to program the editor 514. The program code automatically generated for the editor 516 by the code generation module 506 may be stored in one or more editor memory modules, such as memory 518. In this manner, the developer visually programs the editor 516 at the packet level using graphical manipulations of the input data format to generate the desired output data format, again alleviating the need for the developer to understand the underlying editor architecture. The developer therefore graphically defines a second endpoint of the data stream—the output packet structure. From this packet-level definition, the code generation module 506 automatically generates the program code to cause the editor 516 to arrive at the desired output packet structure at run-time.

Figure 6:
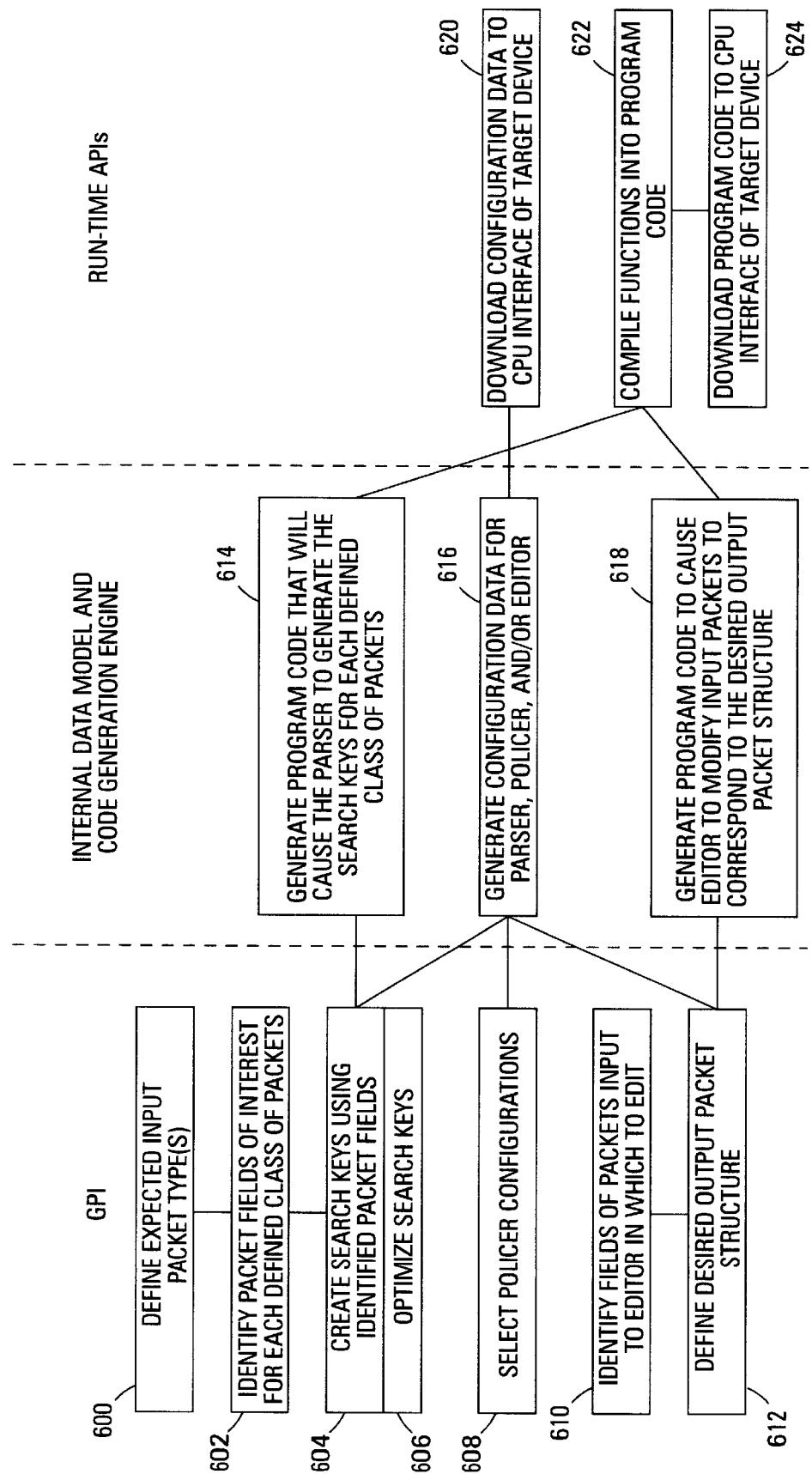
FIG. 6 is a diagram illustrating various functions associated with the graphical programming tool of the present invention.

FIG. 6 is a diagram illustrating various functions associated with the graphical programming tool of the present invention. The user accesses the GPI to input information that is ultimately used by the internal data model and run-time APIs to program the target device, which is an ingress processor in the present example. At the GPI level, the user defines 600 expected packet types that will be input to the ingress processor. The user identifies 602 the packet fields of interest for each defined class of packets, and creates 604 search keys using the identified packet fields. Through the GPI, the user has the ability to manually or automatically optimize 606 the placement of fields in the search keys. As is described more fully below, these GPI actions taken by the user involves graphically generating parser subroutines that classify and parse the incoming data types to produce the optimized search keys. Through the GPI, the user can also select 608 policer configurations. The user also identifies 610 fields of the packets input to the editor module that are to be modified, and defines 612 the desired output packet structure.

Using the search keys, the data model and code generation engine generates 614 program code that will cause the parser to generate the actual runtime search keys for each defined class of packets. Similarly, program code is generated 618 to cause the editor to modify the input packets at run-time to correspond to the desired output packet structure. Configuration data may be generated 616 for any one or more of the parser, policer, and editor.

In one embodiment of the invention, the exported program code is source code, such as C programming language source code. The exported C code is compiled along with the API into the user's run-time code. The run-time code uses the data structures exported by the tool to initialize and configure the system at run time. In this manner, the information graphically entered by the user via the GPI is processed into C program code, exported, compiled, and downloaded to the ingress processor via the APIs.

In order to facilitate an understanding of the GPI in accordance with the present invention, an example is set forth below. The example illustrates and describes various features of the GPI which a developer can utilize to visually program an ingress processor. The principles described in connection with this example are equally applicable to other programmable devices where the GPI is appropriately modified to accommodate such devices, as will be recognized by those skilled in the art from an understanding of the description provided herein. Further, because many of the following illustrations present exemplary display images and graphical user interface (GUI) functions, the terms GPI and GUI may be used interchangeably.

Figure 7:
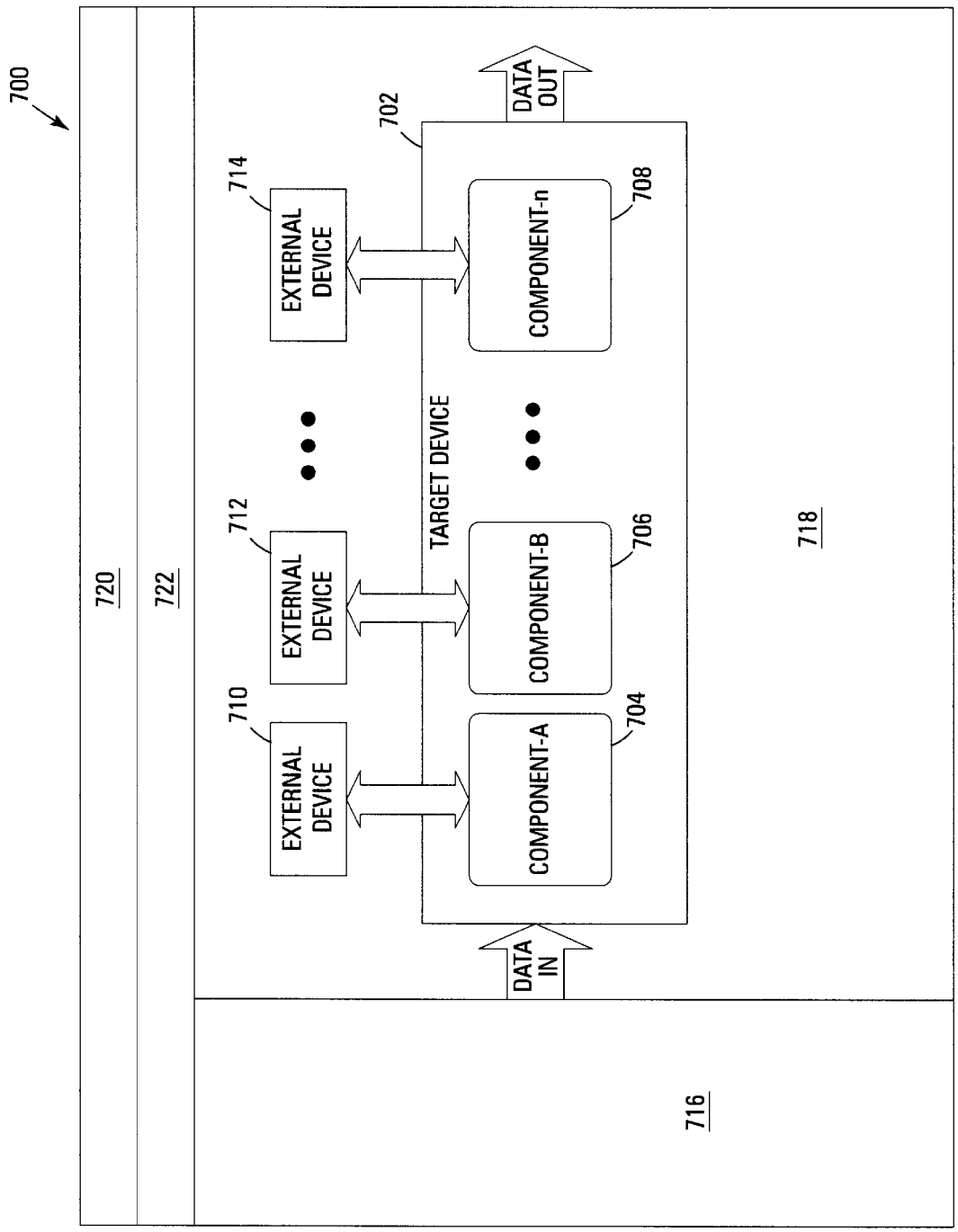
FIG. 7 is a block diagram illustrating an exemplary display format for a main user interface.

FIG. 7 is a block diagram illustrating an exemplary display format for a main user interface 700. The user interface 700 is a starting point for graphically programming a target device, such as an ingress processor, in accordance with the principles of the present invention. The GPI of the present invention is a GUI-based program that generates the microcode and configuration for programming the target device. In the example of FIG. 7, the GPI supports GUI abstractions for visualizing one or more components 704, 706, 708 within the representation of the target device 702. Other external devices 710, 712, 714 may also be abstracted and configured through the GPI. Fundamental operations for these components are defined through the GPI and exported as source code representing microcode, such as C source code. The GPI implements drag-and-drop functionality, left/right mouse-click mechanisms, text entry, and other GUI features. The GPI may also be implemented to recognize voice commands or other audio signals. In one embodiment of the invention, the GPI contains a sample library of predefined functions.

In one embodiment, the GPI includes two primary panes or views. These views are the tree view 716 and the presentation space view 718. The tree view 716 is a representation of hierarchical information including a "root" component (e.g., component-A, component-B, etc.) that can be expanded to expose underlying subroutines. The presentation space view 718 displays the screens relevant to selections made in the tree view 716. Other features include a menu bar 720 and a tool bar 722. One embodiment of the menu bar includes menu items such as "File," "Edit," "Tools," and "Help." Additionally, "pop-up" menus are available throughout the tool.

Figure 8:
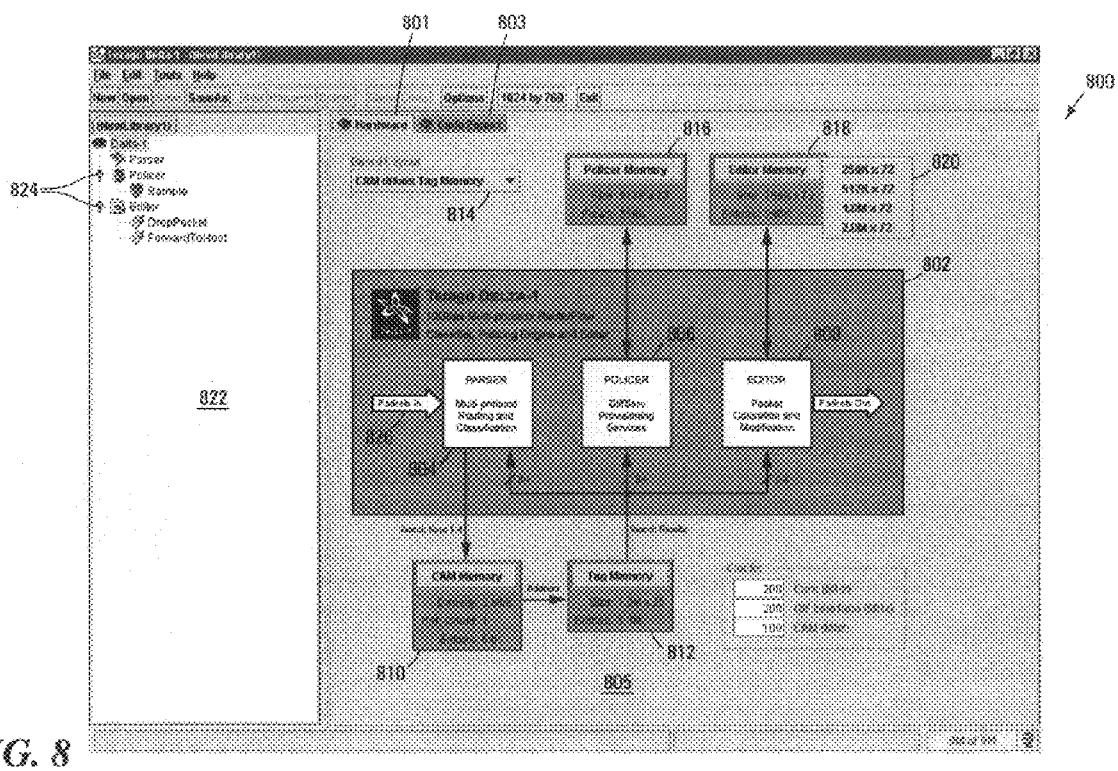
FIG. 8 illustrates an exemplary main user interface screen for graphically programming an ingress processor in accordance with the principles of the present invention.

FIG. 8 illustrates an exemplary main user interface screen 800 for graphically programming an ingress processor in accordance with the principles of the present invention. The screen 800 is also referred to as the "hardware" screen when the hardware tab 801 is selected. The screen 800 changes when the code export tab 803 is selected such that the selections necessary to export code generated in accordance with the invention are presented. The hardware screen 800 provides a representation of the chip or other hardware that is to be programmed in accordance with the invention. In one embodiment of the invention, it is this screen that is presented when a new library is opened or the GPI is started. For purposes of this example, the hardware is an ingress processor 802.

The GPI supports GUI abstractions for visualizing three components within the ingress processor 802 shown in the presentation space view 805, including the parser 804, policer 806, and editor 808. Various manners of linking to a particular component screen are provided, including an active link to each of the parser, policer, or editor component screens when the graphical representation of the respective component is selected via the GPI. These component screens may be reached in other manners, such as through the tree view, menu bar, tool bar, or other navigational tool.

Memory devices that will work in conjunction with the actual ingress processor are also displayed, including representations of a CAM 810 and SRAM 812 used in connection with the parser 804. The memory configuration options that can be used in connection with the parser 804 may be selected via the board layout selector 814. Other memory devices include the policer memory 816 and the editor memory 818. Component configurations, such as the memory size, are selectable for these memories as illustrated by pop-up menu 820 associated with the editor memory 818. In this manner, configuration information for the memories that will be used by the ingress processor can be identified, which assists in the programming of the ingress processor.

The present invention provides for internal configurations of functional blocks, which ultimately change the visual representation and graphical manipulation ability provided to the user. The GPI abstracts the functionality of the particular programmable circuit, e.g., the ingress processor 802. Some of this abstraction is based on how the programmable circuit is set up, which can be defined through internal configurations. For example, radio buttons or other selectable configuration items may be presented to make such an internal configuration setting. As a more particular example, the board layout selector 814 is an internal configuration selector that allows the user to define the manner in which the functionality of the ingress processor is abstracted. In this manner, configuration options may be selected to provide a particular visual representation, and the ensuing graphical manipulation involves manipulating the particular visual representation provided as a result of the configuration option selected.

The user interface screen 800 also includes the tree view 822 which is a representation of hierarchical information of a root component, such as the parser, policer. The root components in the tree view 822 can be expanded to expose underlying subroutines. Parser subroutines are expandable to reveal keysets and an optional level of Stage 2 subroutines, creating the hierarchical tree format. A root node handle symbol 824 before each component identifies whether the component can be expanded to reveal additional sublevels.

The configuration selections made for the parser 804, policer 806, and editor 808 are stored as a library file. Multiple library files may be made to produce multiple configuration selections for the target device, which is the ingress processor 802 in this example. In one embodiment of the invention, the GPI creates and stores the library files in eXtensible Markup Language (XML) format. Each library file may be saved, and previously saved library files may be loaded.

Each of the individual components of the target device may be individually selected to provide user interface screens particular to the selected component. For example, the parser 804 can be selected to reveal user interface screens to program the parser. The parser associated with the ingress processor of the illustrated embodiment performs layer classification and tagging via a search/lookup engine. The parser performs various functions, including conditional branching to unique keysets, field and bit-level extractions, generation of multiple search keys per keyset, and two-stage lookup capabilities. The GPI of the present invention provides a graphical representation of these functions and generates exportable program code (e.g., C programming language code) based on user-defined parser functions. In accordance with one embodiment of the invention, the exported program code includes parser binary and corresponding formatted CAM entries per key. The realization and benefits of a parser module programmable in accordance with the present invention may be determined in a manner described herein and in copending U.S. patent application Ser. No. 09/849,913 entitled "A Method And Apparatus For Providing Multi-Protocol, Multi-Stage, Real-Time Frame Classification", filed on May 4, 2001, which is assigned to the assignee of the instant application, the content of which is incorporated herein by reference.

In accordance with one embodiment of the invention, multiple manners of adding a "subroutine" to the parser are provided. These different manners include selecting the "packets in" arrow and selecting an "add" pop-up menu item. Selection of these graphical items may include, for example, clicking on the "packets in" arrow using a graphical pointing device (e.g., mouse), and then clicking on the "add" pop-up menu item that appears in response to selecting the "packets in" arrow. Other manners of adding such a subroutine are facilitated using the pull-down menus, the tool bars, right-clicking on the parser item in the tree view 822, or other graphical selection mechanisms.

Figure 9:
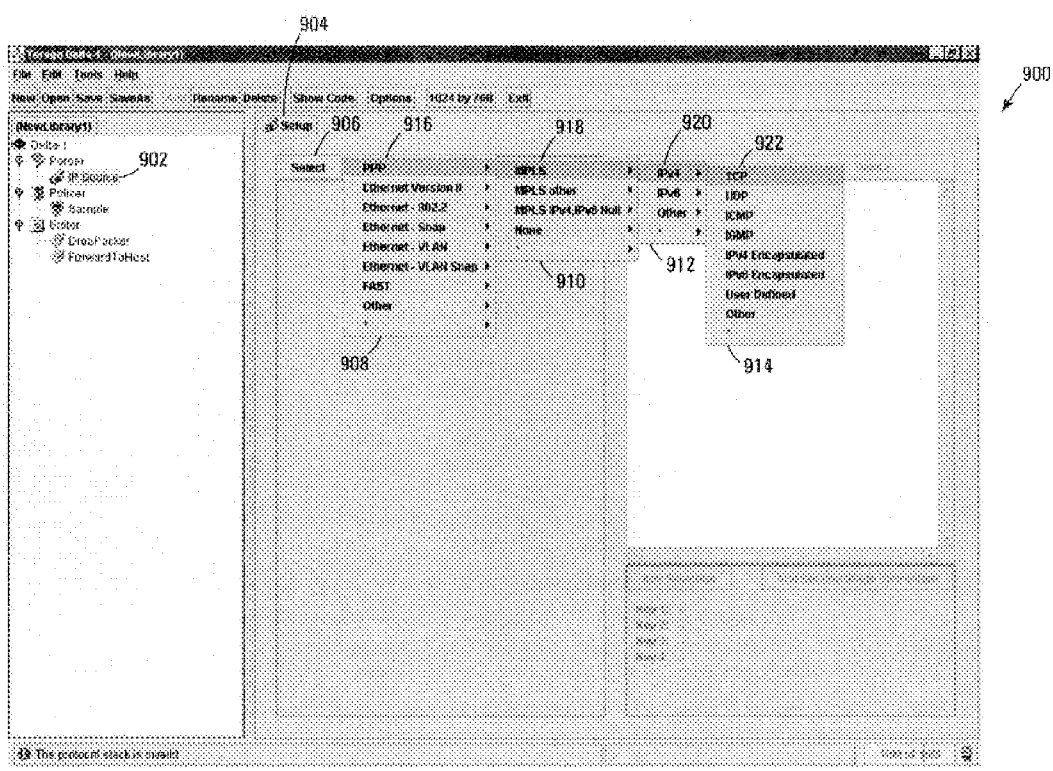
FIG. 9 is an exemplary graphical user interface screen presented upon creation of a new subroutine for the parser module.

FIG. 9 is an exemplary graphical user interface screen 900 presented upon creation of a new subroutine for the parser module. Creation of a "subroutine" essentially involves defining the type of packets that are expected to be received at the ingress processor for the particular application(s) of the ingress processor. As shown in FIG. 9, a subroutine 902 has been created for the parser, which has been renamed as "IP Source" for purposes of illustration. This representative name is provided for purposes of this example to indicate that the subroutine being created is to categorize packets by their IP source address. Renaming of the subroutine may be effected in various manners, such as right-clicking on a default subroutine name and renaming, or other known manners of renaming files.

Because the parser module is designed to classify packets, one of the first steps is to define the protocol stack of packets entering the parser. To define the subroutine's protocol stack via the GPI, a "setup" tab 904 is provided on the screen 900. Associated with this screen is a selectable item, referred to in this example as the "select" button 906. Clicking on (or otherwise selecting) the select button 906 presents a series of cascading pop-up menus, such as pop-up menus 908, 910, 912, and 914. The number of pop-up menus presented depends on the number of layers associated with the expected incoming packet format. For example, the illustrated embodiment of FIG. 9 illustrates that selection of a PPP option 916 (layer-2) presents pop-up menu 910 which corresponds to layer-2.5 (e.g., MPLS-related). Selection of the MPLS option 918 presents pop-up menu 912, which provides various selectable layer-3 choices, such as IPv4, IPv6, or other layer-3 options. In the illustrated example, the IPv4 option 920 has been selected, which in turn presents the layer-4 options, including TCP, UDP, ICMP, IGMP, IPV4 Encapsulated, IPv6 Encapsulated, or any other layer-4 option available or defined by the developer. In this example, the TCP option 922 has been selected as the layer-4 option. Thus, the selection illustrated in FIG. 9 indicates that the expected packet format for layers-2–4 is PPP/MPLS/IPv4/TCP.

Figure 10:
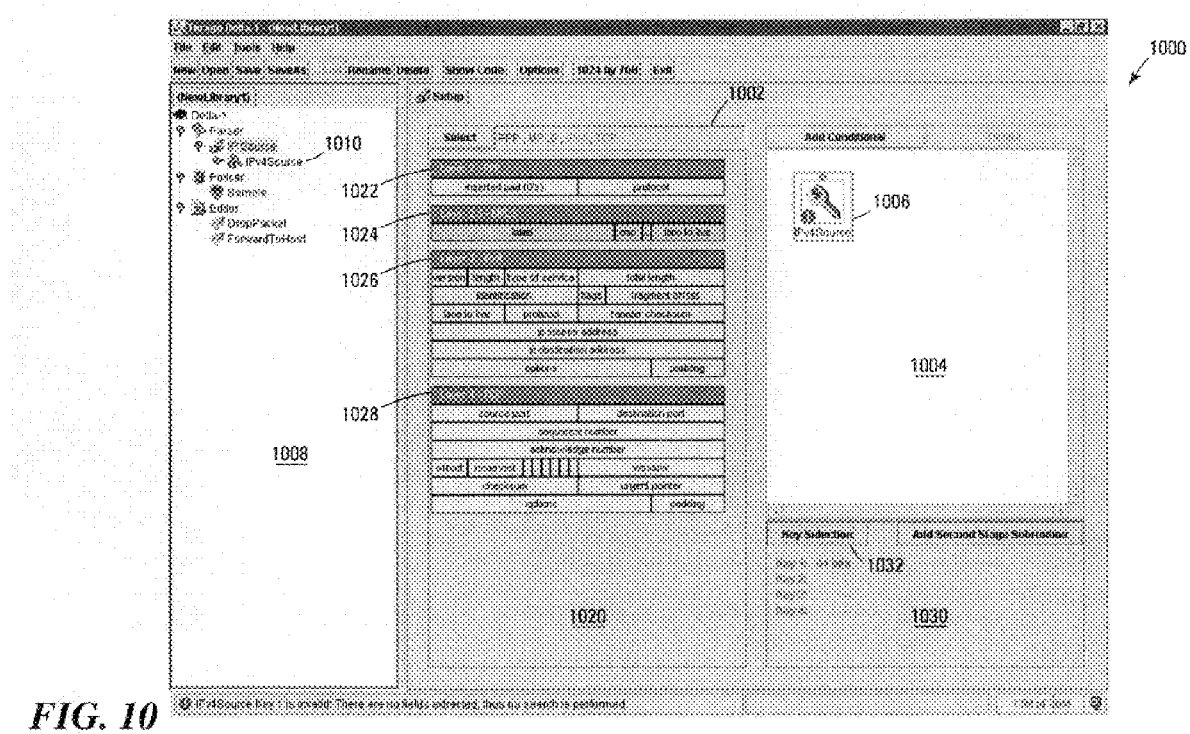
FIG. 10 illustrates an exemplary presentation space view that is presented upon selection of the desired protocols.

When the desired protocols have been selected, the presentation space view changes to that shown via the representative parser screen 1000 of FIG. 10. The protocols selected are displayed in the protocol field 1002. The right pane 1004 now depicts a keyset icon 1006 representing the newly created "keyset," which in this example includes a single key which is sixty-four bits in length. This icon may be provided with a default name, but is illustrated with a name change to "IPv4 Source." As seen in the tree view 1008 of the user interface screen 1000, the addition of the keyset "IPv4 Source" 1010 may also be displayed in the tree view. Thus, the created subroutine "IP Source" now includes a keyset labeled "IPv4 Source" which includes a 64-bit single key. As will be described more fully below, the icon 1006 itself may change depending on the number of keys associated with the particular keyset.

In connection with the generation of keys, validity feedback may be provided. The validity feedback is based on an underlying rules model of the programmable circuit, i.e., an ingress processor in the current example. The generation of a particular portion of the program code ultimately depends on the state of the validity feedback. For example, in the creation of the key 1006, if errors and/or disallowed entries are made in the creation of the key, real-time validity feedback marks the key as invalid. In one embodiment of the invention, such an invalid key will have to be accordingly modified in order for program code to be generated to create that key at run-time deployment of the programmable circuit. In one embodiment of the invention, a graphical, audible, or other notification is presented to the user to notify the user. In another embodiment of the invention, this validity feedback is continuously updated as a user graphically proposes modifications to the visual representation of the memory search key, where "continuously" for purposes of this description means that it is performed as the user makes entries although there may be temporal gaps in validity monitoring.

In a center pane 1020, the header fields for each of the protocol layers are displayed. For example, the expected packet format for layers-2–4 was selected as PPP/MPLS/IPv4/TCP. The PPP header information (layer-2) is shown in block 1022, the MPLS header information (layer-2.5) is shown in block 1024, the IPv4 header information (layer-3) is shown in block 1026, and the TCP header information (layer-4) is shown in block 1028. Other layers may also be displayed, depending on the subroutine selected.

Figure 11:
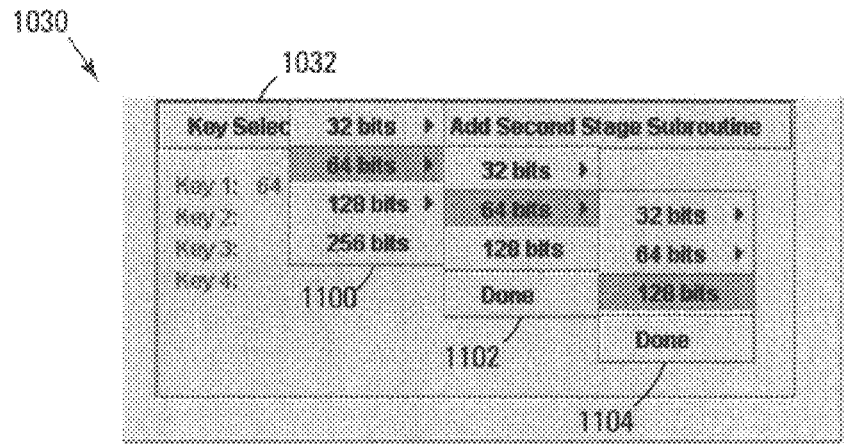
FIG. 11 illustrates a series of cascading pop-up menus for the key selection field.

A key selection field 1030 is provided as part of the presentation space view of the parser screen 1000. This field 1030 includes a "key selection" button 1032, selection of which provides a series of cascading pop-up menus as shown in FIG. 11. Referring to FIG. 11, the key selection field 1030 of FIG. 10 is shown with multiple pop-up menus 1100, 1102, and 1104 displayed. The number of pop-up menus displayed depends on the key length selections, assuming a predetermined maximum bit-length for the keyset. In one embodiment of the invention, a total of 256 bits are available for keyset search key construction, and up to four keys per keyset may be defined. In the illustrated embodiment of FIG. 11, three keys are defined for the "IP Source" keyset, including a 64-bit key selected from pop-up menu 1100, a 64-bit key selected from pop-up menu 1102, and a 128-bit key selected from pop-up menu 1104. Bit combinations that are not valid constructs are automatically prohibited from being a selectable item.

Figure 12:
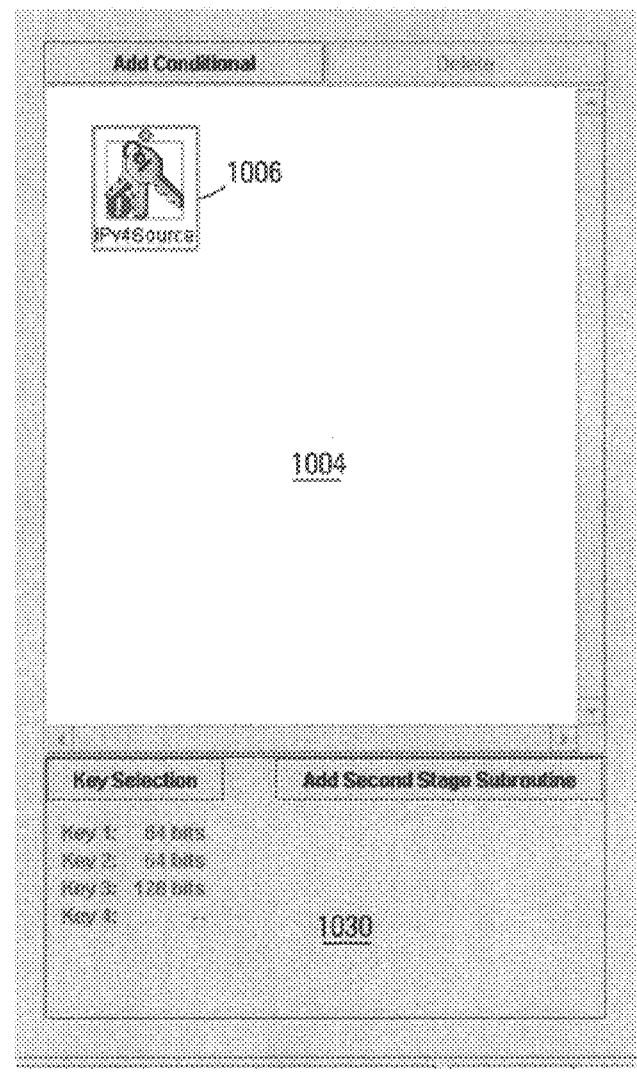
FIG. 12 illustrates an exemplary presentation view that is presented when the desired number of keys have been constructed.

In one embodiment of the invention, each subsequent cascading popup menu is presented in response to selection of a value in the current pop-up menu. For example, selection of the "key selection" button 1032 presents pop-up menu 1100, selection of an option in pop-up menu 1100 presents pop-up menu 1102, and so forth. When the desired number of keys have been constructed in a manner described in FIG. 11, the pane 1004 and key selection field 1030 are modified as shown in FIG. 12. For example, the selection of three keys, including two 64-bit keys and one 128-bit key, is presented in the key selection field 1030. Further, the keyset icon 1006 for the "IPv4 Source" keyset is modified to show that three keys are associated with this keyset. For example, three key symbols may be presented in the keyset icon 1006 to visually identify three keys in the "IPv4 Source" keyset.

Figure 13A:
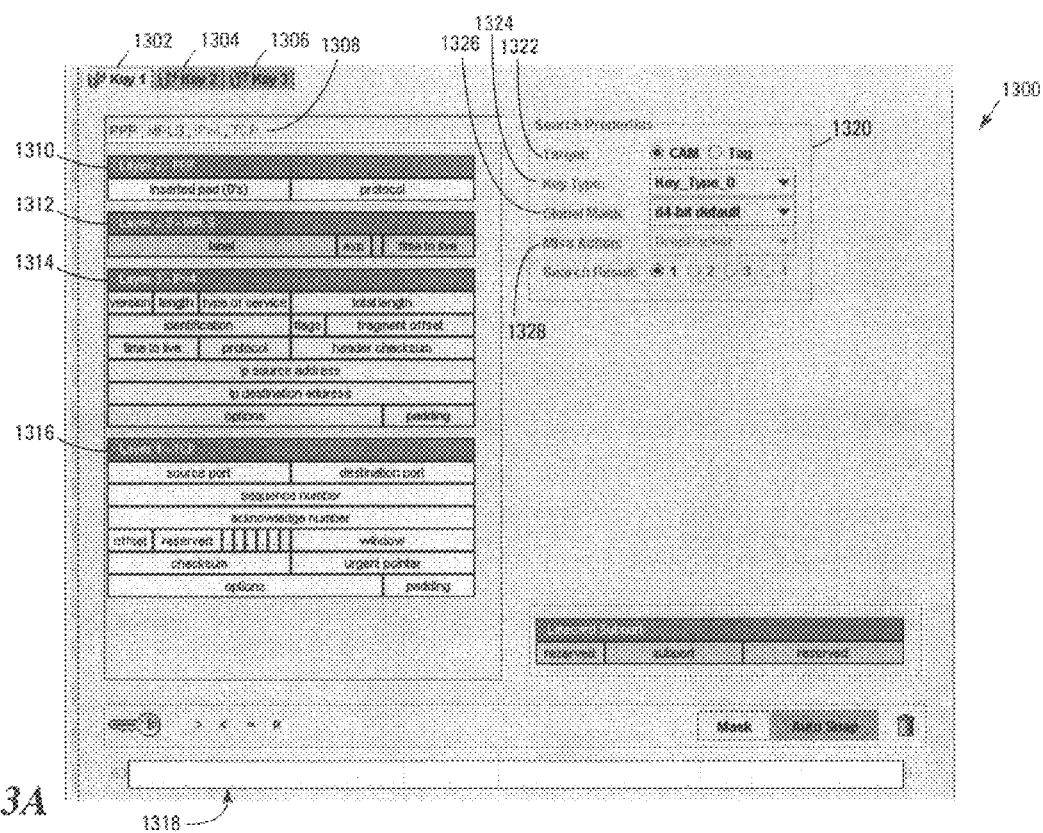
FIGS. 13A and 13B illustrate exemplary presentation space views for constructing search parameters for each defined key when the keyset has been selected for configuration.

Each defined key may be configured with search parameters. Selecting the IPv4 Source keyset to construct the search parameters may be initiated by selecting the keyset icon 1006, selecting the appropriate item from the tree view, or other selection mechanism provided by the user interface. FIG. 13A illustrates the presentation space view 1300 for constructing search parameters for each defined key when the keyset has been selected for configuration.

In the illustrated embodiment, three keys were defined, Configuration of search parameters for each key is accomplished by selecting each key from the key tabs 1302, 1304, and 1306, which correspond to Key 1, Key 2, and Key 3 respectively. The number of key tabs corresponds to the number of keys that were defined. Each tabbed key tab displays its respective protocol layers from which to extract protocol fields in protocol layer field 1308.

A first key, Key 1, is considered by selecting the Key 1 tab 1302. The protocol layer field 1308 shows that the protocols for Key 1 are PPP/MPLS/IPv4/TCP. The headers for each layer are shown in blocks 1310, 1312, 1314, and 1316, where each block corresponds to one of the protocol layers of the selected key. A blank search key 1318 is presented having a bit-length corresponding to the length defined. For example, Key 1 was identified as a 64-bit key, so a blank 64-bit search key 1318 is presented. Search key fields from the various protocol header blocks 1310, 1312, 1314, 1316 can be extracted and added to the key word 1318, as described more fully below.

A "search properties" field 1320 allows designation of various search properties. The representative search properties field 1320 includes selectable options for the type of search that will be performed, such as a CAM or tag search. The type of search thus reflects what the "target" of the search words will be, and therefore this option is identified as the target 1322 search property. A key type property 1324 allows the user to select one of a predetermined number (e.g., 256) user-defined key types. A predefined or user-defined global mask may be selected via the global mask property 1326, where the global mask filters by selected key width. The miss action 1328 search property allows for selection of certain actions to be taken when a target "miss" occurs. For example, the packet may be dropped.

It should be noted that in one embodiment of the invention, selection of a "tag" option or other non-CAM memory device in the target search property 1322 may result in a lesser number of usable bits available in the search key 1318. For example, where a tag memory (e.g., SRAM) is selected, only twenty bits are available to form the key in one embodiment of the invention where a 1-Megabit memory is identified as the memory associated with the parser. This is due to the nature of the addressing of the memory. This is not the case when a CAM is used, as a CAM receives data and outputs an address which can then be used to address a memory such as an SRAM.

In one embodiment of the invention, fields from the protocol header blocks 1310, 1312, 1314, 1316 are entered into the search key 1318 using drag- and-drop methodologies. This graphical manner of populating the search key 1318 is convenient and provides a visual correlation between the header fields and the resulting search key. Pop-up tool tips are provided in one embodiment of the invention, such as tool tip pop-up 1338 shown in FIG. 13B, which provides the field name and length. This is particularly useful for short fields in which the label cannot be fully displayed in the header field.

Figure 13B:
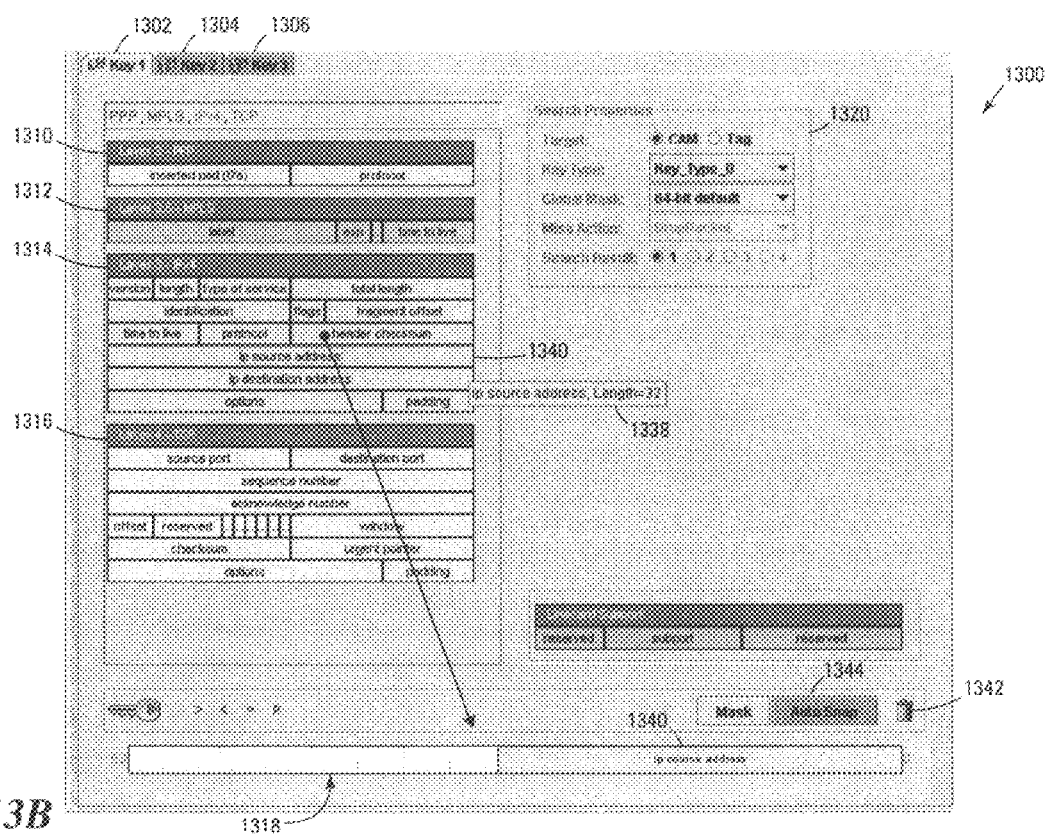

An example of entering fields into the search key 1318 using the drag-and-drop method is shown in FIG. 13B. A protocol field labeled "ip source address" from the IPv4, layer-3 protocol header block 1314 is moved to the search key 1318 by dragging the "ip source address" field 1340 to the search key 1318. The field 1340 can be positioned at any desired bit offset in the search key 1318. When the field 1340 is in a valid drop location in the search key 1318, it is displayed in the search key occupying the appropriate number of bits required for the field. Once positioned in the search key 1318, fields can be moved to different bit positions by dragging the field within the search key 1318. Fields moved into the search key 1318 may be deleted in various manners, including dragging the field to a predetermined location on the screen 1300, such as the garbage can icon 1342.

In another embodiment of the invention, the screen 1300 includes a selectable icon or button to facilitate optimization of the code generation associated with providing fields in the search key 1318. For example, the "Auto Snap" button 1344, when selected, automatically positions the extracted fields to the most efficient locations in a key, based on the clock cycles required to execute the extraction. For example, the GPI may determine that the most efficient extractions occur with byte-oriented source data placed on byte boundaries in the search key 1318. In such a case, selection of the "Auto Snap" button 1344 will automatically position the field 1340 along the byte boundary resulting in the location that requires the least number of clock cycles.

In one embodiment of the invention, the code generated by the GPI to effect the field extraction into the search key 1318 may be displayed in a pop-up box or other display screen. In this manner, the actual code is generated in real time and can be viewed as the extracted fields are moved within the search key 1318. For example, positioning the "ip source address" field 1340 at bit locations 2–33 may result in the generation of ten or twenty lines of code required to perform such an extraction, while positioning field 1340 at bit locations 0–31 (or selecting the "Auto Snap" button 1344) may result in the generation of just a few lines of code due to the byte-oriented field 1340 being positioned at byte boundaries in the search key 1318.

Figure 14:
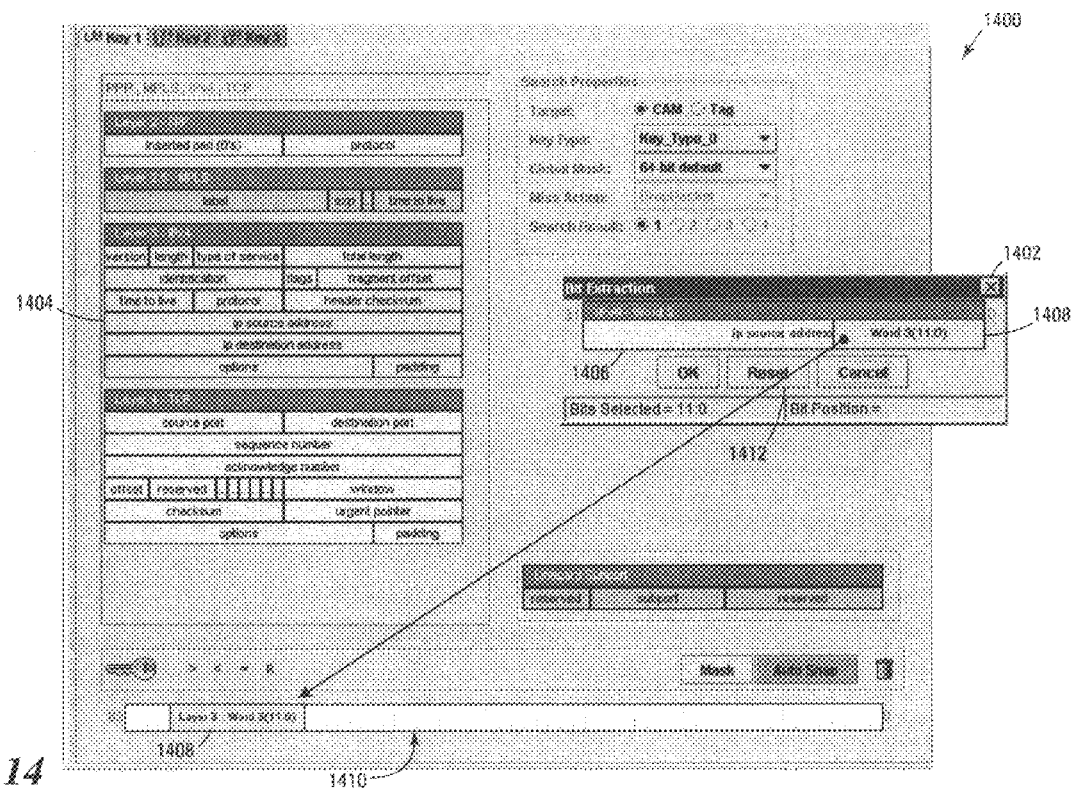
FIG. 14 is another exemplary presentation space view illustrating a manner for graphically facilitating bit extraction into a search key via a bit extraction dialog box.

One embodiment of the present invention includes a bit extraction feature that allows users to select a portion of a selected protocol field for use in the search key. Another view of a presentation space view associated with the parser is shown in FIG. 14, where the user interface screen 1400 is similar to that described in connection with FIG. 13. A bit extraction dialog box 1402 is presented upon initiating the bit extraction feature. This feature may be initiated in a variety of manners, including using the menus and toolbars. In one embodiment, the bit extraction feature is initiated by clicking (e.g., right-clicking) a mouse device while positioning the pointer over a particular field of interest. This presents a bit extraction menu (not shown) from which the bit extraction feature may be initiated. For example, the pointer may be positioned over the "ip source address" field 1404, right-clicking the mouse, and selecting to execute bit extraction. Initiating the bit extraction feature in this manner presents the bit extraction dialog box 1402.

The bit extraction dialog box 1402 includes an extraction field 1406 corresponding to the field or group of fields selected as the subject of the bit extraction, which in the foregoing example is the "ip source address" 1404 associated with the layer-3 IPv4 header. The pointer may be positioned within the extraction field 1406, and dragged along desired bit positions within the extraction field 1406 to select the bits of the "ip source address" that are desired. For example, dragging the mouse pointer over bits 0–11 will select the twelve least significant bits of the "ip source address," shown as word 1408. In one embodiment, performing this dragging motion provides a visual indicator (e.g., a line, highlight, etc.) over the bit positions being selected. The created word 1408 is then dragged into the search key 1410 to the desired position. If the dragging operation included unwanted bits, the reset button 1412 can be selected, allowing the user to repeat the operation until the desired bit range is properly selected.

Figure 15A:
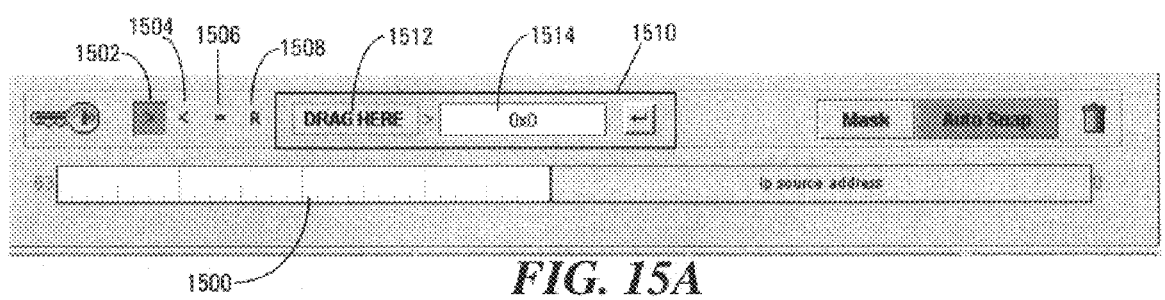
FIGS. 15A, 15B, and 15C illustrate an exemplary manner for utilizing search key comparison bits in accordance with one embodiment of the invention.
Figure 15B:
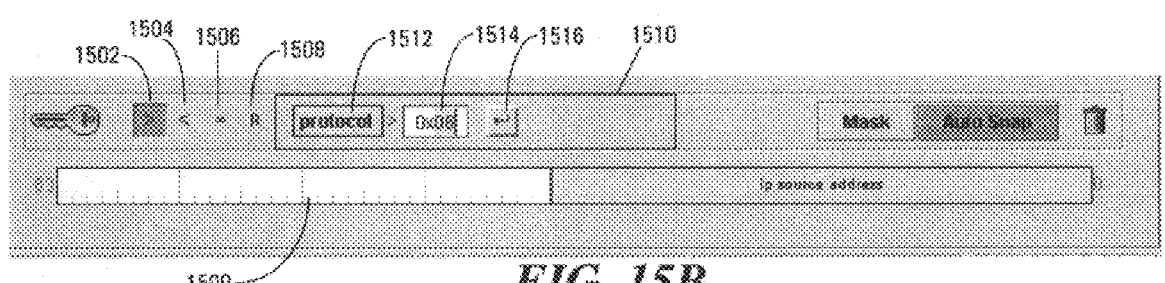
Figure 15C:
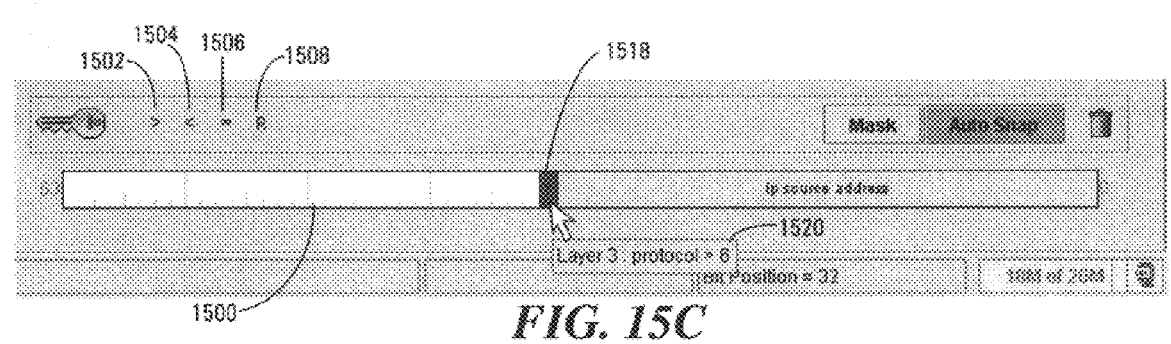

FIGS. 15A, 15B, and 15C illustrate an exemplary manner for utilizing search key comparison bits in accordance with one embodiment of the invention. The search key, shown in FIGS. 15A, 15B, and 15C as search key 1500, may be configured to include comparison bits. More particularly, one or more bits can be set in the search key 1500, based on a comparison result of a selected field's value to another (e.g., user-entered) value. Referring first to FIG. 15A, multiple comparison operators may be provided, such as a greater-than operator 1502, less-than operator 1504, equal-to operator 1506, range operator 1508, or other operators. To perform a comparison, the desired comparison operator is selected, such as the greater-than operator 1502. This can be selected in a variety of manners, including selecting using a mouse or other pointing device. When one of the comparison operators has been selected, a comparator constructor area 1510 appears with a block 1512 in which header fields can be inserted, and one or more text areas 1514 for entry of comparison values. More particularly, header fields can be dragged into the block 1512 as the header field to be compared, and the value(s) to be compared to the header field is inserted into the text area(s) 1514. In the case of greater-than, less-than, and equal-to operators, one text area 1514 is displayed to enter a value to compare to the field entered in the block 1512. In the case of range checks, two text areas 1514 are provided for comparison of the field in block 1512 to the identified range of values.

FIG. 15B illustrates an example where the "protocol" field from the layer-3 IPv4 block has been dragged into block 1512. The protocol field identifies the next protocol that follows the IP header. For example, a protocol field value of "1" indicates an ICMP protocol that follows the IP header, and a value of "6" indicates that a TCP protocol follows the IP header. The name of the dragged field is now displayed in the block 1512, with the appropriate comparison operator positioned between the block 1512 and the text area 1514. The value for the comparison is then entered into the text area 1514, which in the present example is the value of "06." As indicated above, the value "6" indicates that the next protocol following the IP header is TCP.

Once the comparison value is entered, the comparison is ready to "commit." This is accomplished by selecting the commit button 1516. Once committed, a resulting comparison bit 1518 appears in the search key 1500 as shown in FIG. 15C. This comparison bit 1518 therefore contains the 1-bit result of the comparison performed. In this example, the 1-bit result in the comparison bit 1518 will be a first value (e.g., "0") when the "protocol" field has a value that is not greater than "6," and will be a second value (e.g., "1") when the protocol field has a value that is greater than "6." The comparison results can be viewed by positioning the mouse pointer over the comparison bit 1518 in the search key 1500, and a tool tip 1520 appears displaying the specifics of the comparison.

Figure 16A:
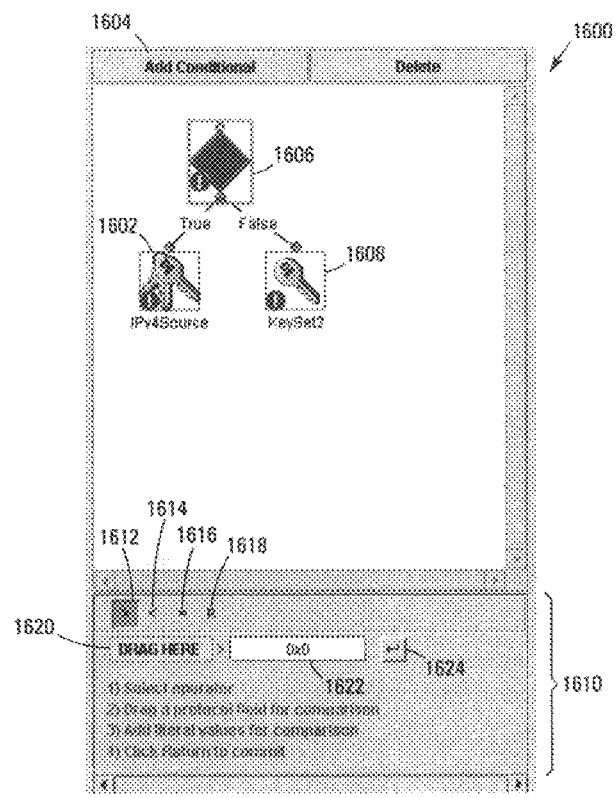
FIGS. 16A, 16B, and 16C illustrate an exemplary subroutine conditional which allows one of a plurality of keysets to be used for generation of the search key(s) depending on the result of a comparison operation.
Figure 16B:
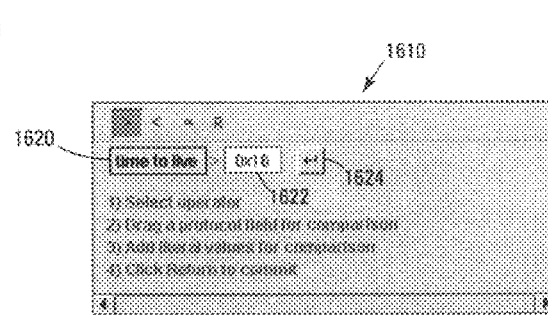
Figure 16C:
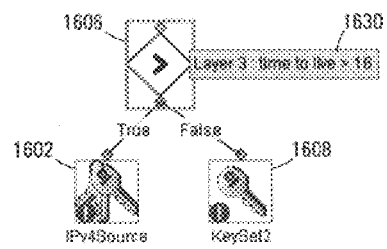

Subroutine "conditionals" may also be added. Subroutine conditionals allow one of a plurality of keysets to be used for generation of the search key(s) depending on the result of a comparison operation. FIGS. 16A, 16B, and 16C illustrate an exemplary subroutine conditional. In one embodiment of the invention, each subroutine conditional includes two blocks. These blocks include a conditional comparison block used to compare protocol fields to specific values, and further include two keysets (having one or more keys each), one of which will be built depending on the run-time results of the conditional comparison. The GPI in accordance with the present invention supports multiple conditional comparisons, resulting in multiple unique keysets per subroutine.

FIG. 16A illustrates the manner in which a conditional branch operation may be performed in accordance with the present invention. Initiating the addition of a conditional may be accomplished in a number of ways. In accordance with one embodiment, the parser subroutine name is selected in the tree view (not shown). The previously constructed keyset 1602 (e.g., "IPv4 Source") is displayed in the presentation space 1600. When the "Add Conditional" button 1604 is selected, a new conditional 1606 is added as the parent of the keyset. In addition, a new keyset, shown as KeySet2 1608, is created as another child of the conditional 1606.

When the new conditional 1606 is selected (e.g., clicking on conditional 1606 with the mouse pointer), a comparator constructor block 1610 is presented within the presentation space 1600. Various comparison operators are provided in the comparator constructor block 1610, such as the greater-than operator 1612, less-than operator 1614, equal-to operator 1616, range operator 1618, or other operators. In this example, the greater-than operator 1612 is selected. A protocol field is then dragged or otherwise entered into block 1620, and the value(s) to be compared to the header field is inserted into the text area(s) 1622. In the case of greater-than, less-than, and equal-to operators, one text area 1622 is displayed to enter a value to compare to the field entered in the block 1620. In the case of range checks, two text areas 1622 are provided for comparison of the field in block 1620 to the identified range of values.

Referring now to FIG. 16B, the comparator constructor block 1610 is displayed with a "time to live" field in block 1620, and a value of "16" entered in the text area 1622. This comparison will compare the value in the "time to live" field of the layer-3, IPv4 header to a value of "16." Once the value has been entered, the commit button 1624 is selected. In one embodiment, the conditional branch icon 1606 is changed to display the comparison operator selected, as shown in FIG. 16C. When the cursor is positioned over the conditional branch icon 1606, a tool tip 1630 may also be displayed to identify the protocol field, the comparator operator, and the entered comparison value. In the example of FIGS. 16A, 16B, and 16C, a value greater than "16" in the "time to live" field of the layer-3, IPv4 header will cause the IPv4 Source keyset 1602 to be utilized, while a value that is less than or equal to "16" will cause the KeySet2 keyset 1608 to be utilized. Additional conditionals and keysets may also be included.

Multi-stage parser lookups are also supported. For example, in one embodiment, two-stage parser lookups are supported, allowing the use of the first lookup results to be used in a second stage key. Stage 2 subroutines are thus tied to Stage 1 keys. Second stage subroutines may be initiated using the menus, toolbars, or other user interface items.

Figure 17:
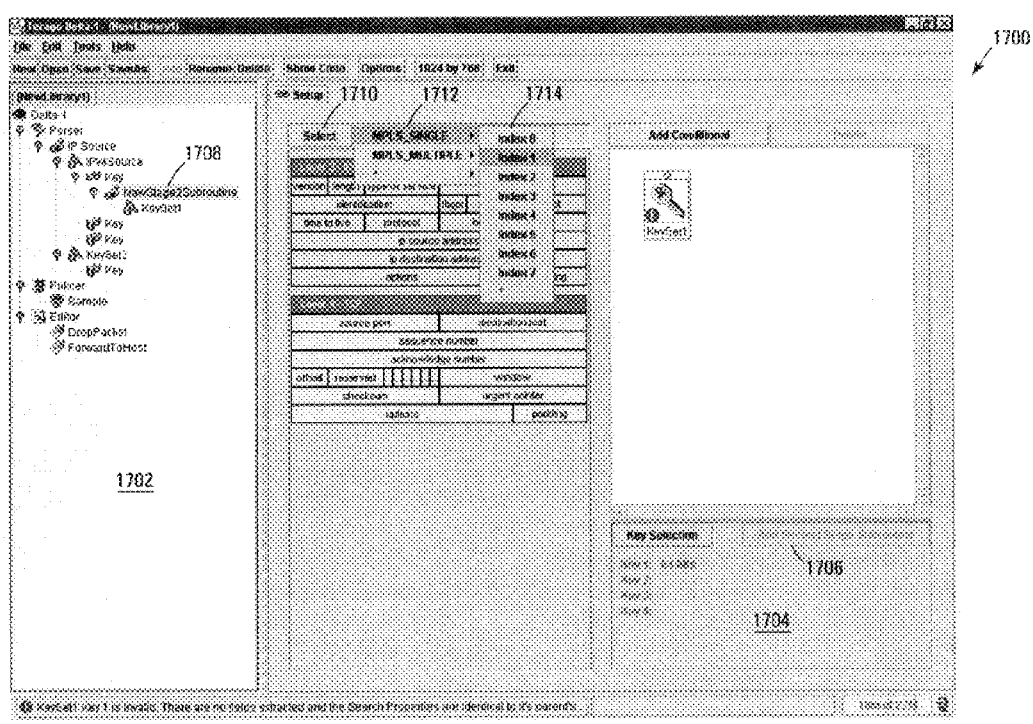
FIG. 17 illustrates an exemplary parser screen from which a second stage subroutine may be added.

FIG. 17 illustrates an exemplary parser screen 1700 from which a second stage subroutine may be added. In stage 2, searches are performed for keys explicitly modified in stage 2. Such modifications include additional extractions and changes to search properties. Second stage subroutines may be initiated through the tree view 1702, or through the key selection field 1704 using the "Add Second Stage Subroutine" button 1706. A second stage subroutine may be associated with any one or more of the keys of a keyset, as illustrated by the second stage subroutine "NewStage2Subroutine" 1708 shown in the tree view 1702. In one embodiment, up to eight stage 2 subroutines may be added to a single parser subroutine keyset, although more stage 2 subroutines may be provided in accordance with the invention.

When a particular stage 2 subroutine has been selected, such as the NewStage2Subroutine 1708, the jump vector associated with the new stage 2 subroutine may be selected. This may be accomplished by clicking on or otherwise selecting the "select" button 1710, which provides further pop-up menus. A first pop-up menu 1712 is illustrated which allows the user to select whether there will be single or multiple ingress MPLS labels for that packet. Once this is selected, an index pop-up menu 1714 is provided to allow the user to select an index. The index corresponds to a predetermined set of bits in the search result, such as bits 28–30. The search result represents the resulting information provided from a memory or CAM/memory combination that is indexed using the generated search key. Another bit(s) may be used to indicate a stage 2 result, such as bit 31. In another embodiment, such a bit(s) (e.g., bit 31) is controlled via the tag value stored in memory. The resulting jump vector description may be, for example, MPLS_SINGLE/ Index 1/IPv4/TCP. This corresponds to the jump vector initiated when a search result is received indicating stage 2, and stage 2 subroutines will thus be created that will be called by all matching *, *, layer-3, layer-4 subroutines, where * indicates the selected MPLS and index values.

Figure 18:
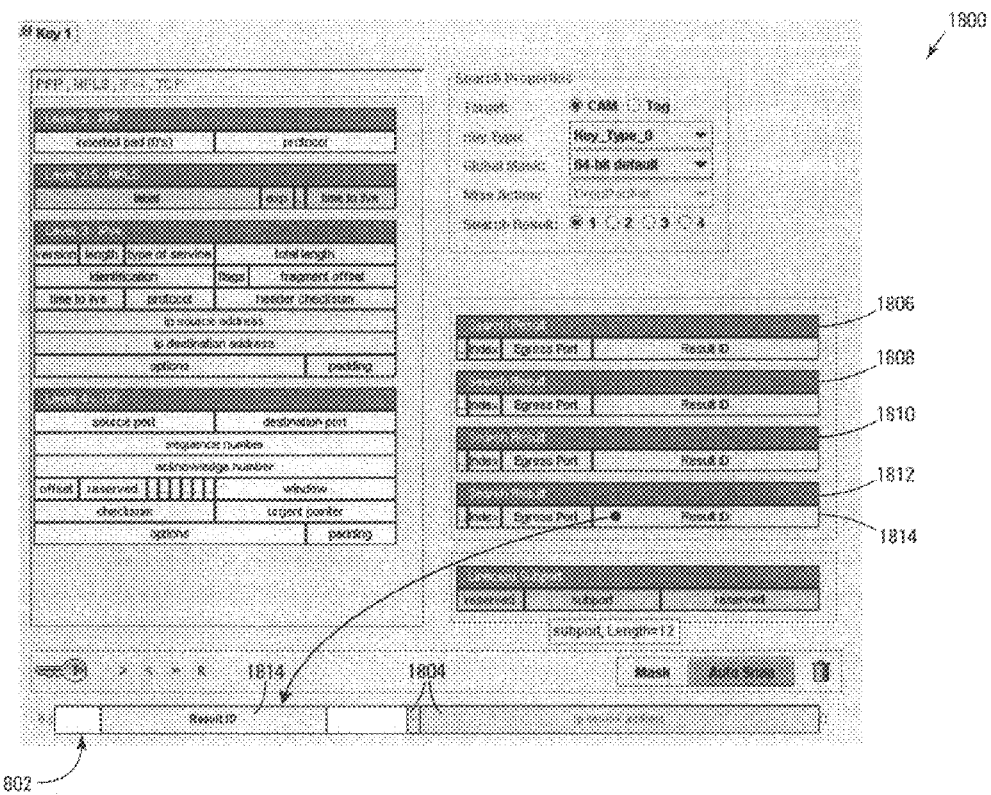
FIG. 18 illustrates an exemplary user interface screen provided when a second stage subroutine has been created.

When the stage 2 subroutines have been created, a user interface screen is provided such as screen 1800 shown in FIG. 18. This screen provides the search key 1802 with the first stage subroutine search set displayed, but displayed in a predetermined manner such as "grayed out." The first stage subroutine search set is shown as grayed out fields 1804, which indicates that the extractions from the first stage are still present in the keys. An additional option for the search key is provided, which includes the search results 1806, 1808, 1810, 1812 from the first stage search. Fields from these search results 1806, 1808, 1810, 1812 can be used in the search key 1802, such as by dragging the desired fields into the search key 1802. An example is provided where the "Result ID" 1814 from the search result 1812 is dragged into the search key 1802.

Figure 19:
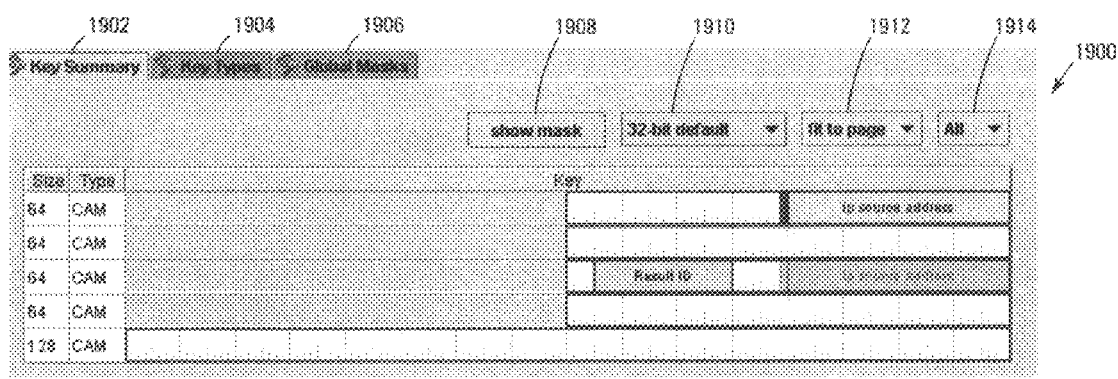
FIG. 19 illustrates a screen image of a portion of the parser main screen after the various subroutines have been created.

FIG. 19 illustrates a screen image 1900 of a portion of the parser main screen after the various subroutines have been created. In the illustrated embodiment, the screen 1900 includes three tabs, including the key summary tab 1902, key types tab 1904, and global masks tab 1906.

Selection of the key summary tab 1902 allows user to display a summary view of the constructed keys for all parser routines. An example of such a view is provided in FIG. 19. The various selectable buttons 1908, 1910, 1912, and 1914 allow the user to specify information as to how the summary information is to be displayed. For example, selection of the "show mask" button 1908 displays the CAM Global Mask as selected by the mask select button 1910. In one embodiment, there are a plurality (e.g., four) of pre-defined masks, and a plurality (e.g., twelve) of user-defined global masks available for selection. Where mask bits are cleared, the corresponding bits in the key summary displays will be "grayed out." Selection of the mask select button 1910 allows selection of any of a plurality of predefined and user-defined masks. Global masks are defined from the global masks tab 1906. The size view button 1912 allows for display at different zoom levels, and the key size select button 1914 allows for selection of specific size keysets to view in the key summary view. For example, the user can select to view all of the parser subroutine and stage 2 subroutine keysets. Alternatively, selection of a particular bit-size displays only keys of the selected bit size.

Figure 20:
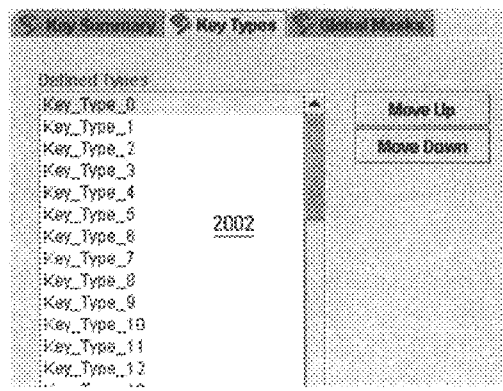
FIG. 20 is an exemplary screen image that facilitates identifies a plurality of defined key types.
Figure 21:
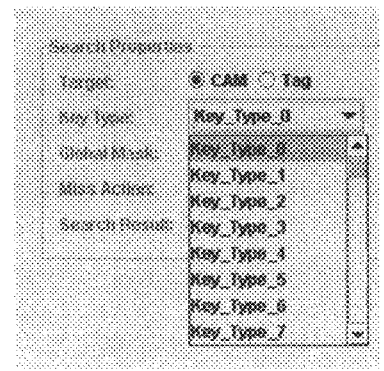
FIG. 21 is an exemplary graphical interface illustrating one manner in which key types and are selectable during key construction as one of the search properties.

Selection of the key types tab 1904 presents a screen 2000 as shown in FIG. 20. In one embodiment, a plurality of defined key types are displayed in the key type display field 2002. Key types contain values that are used in the construction of the search keys, and are selectable during key construction as one of the search properties, such as key type property 1324 shown in FIG. 13A, and again depicted in FIG. 21. In one embodiment, key types are relevant only for CAM searches.

Figure 22:
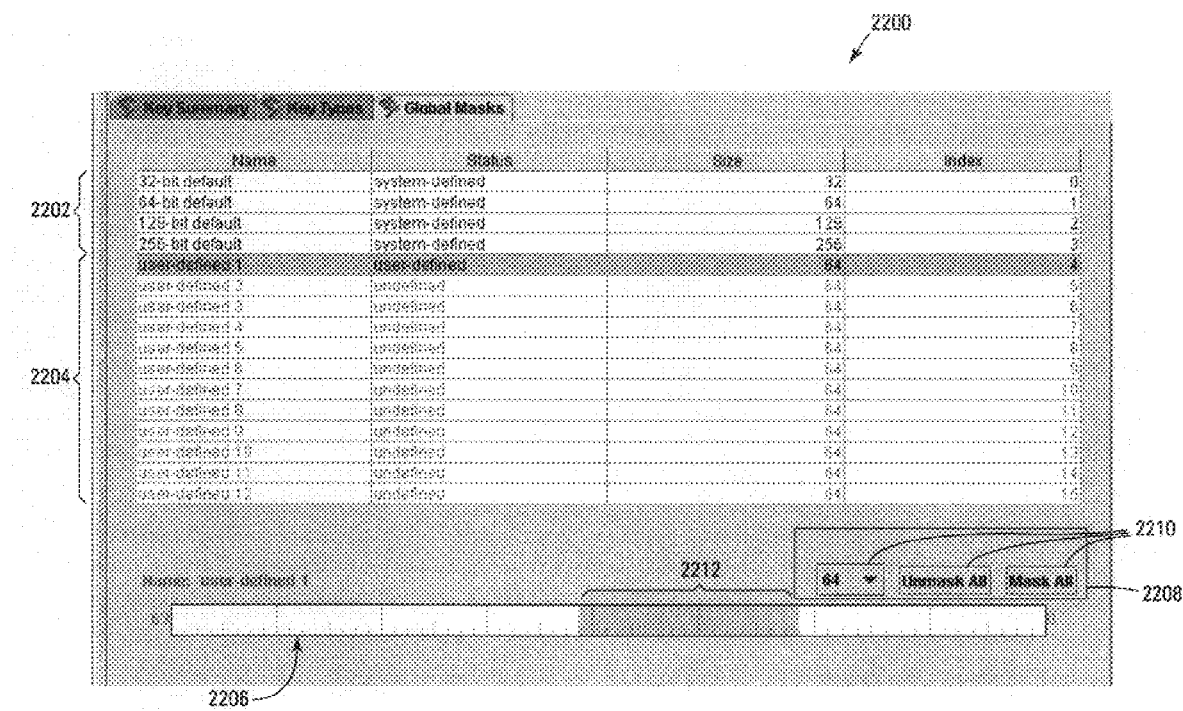
FIG. 22 illustrates an exemplary screen presented upon selection of the global masks tab.

FIG. 22 illustrates a screen 2200 presented upon selection of the global masks tab, which was shown as the global masks tab 1906 in FIG. 19. In one embodiment of the invention, sixteen available global masks are provided and displayed on screen 2200. Some of the global masks may be system defined, such as global masks 2202, while others may be user-defined such as global masks 2204. In one embodiment of the invention, every CAM search key construction requires that a global mask of the same size as the search key under construction be used. Thus, the four system-defined global masks 2202 provide one global mask for each search word length that are always available and identified as defaults (e.g., 32-bit default, 64-bit default, 128-bit default, 256-bit default). When a system-defined global mask is selected from the table, the mask is displayed on the screen 2200, such as mask 2206.

To build a global mask (e.g., a user-defined global mask), selectable mask definitions are provided in the mask definition area 2208. From the associated selectable mask definition buttons 2210, the mask can be defined as the user desires. For example, the mask length can be defined, and/or all or none of the bits can be identified as masked. Further, particular bits to be masked can be identified, such as illustrated by the mask field 2212. This can be accomplished by dragging the mouse pointer (or other graphical device) along the bit locations in the mask 2206 that are to be masked. Once built, global masks may be selected to view the effect of the mask on all keys, using the show mask button 1908 previously shown in FIG. 19. The mask may also be applied during key construction at the individual keyset level. For example, using the global mask pull down selection 1326 shown in FIG. 13A, users may apply global masks to keys under construction to verify their proper placement with regards to the search fields being used.

In accordance with one embodiment of the invention, the ingress processor includes a policer component. The policer associated with the exemplary ingress processor performs policing of various flows (e.g., DiffServ, IP, MPLS, FAST, etc.) for conformance to a maximum allowed "peak" rate and a contractually obligated "committed" rate. An exemplary policing engine provides up to 1 million flows, supports unique rate per flow, and supports two-rate and three-color policing schemes. The realization and benefits of a policing engine which is configured in accordance with the invention may be determined in a manner described herein and in copending U.S. patent application Ser. No. 09/849,914 entitled "System And Method For Policing Multiple Data Flows And Multi-Protocol Data Flows," filed on May 4, 2001, and U.S. patent application Ser. No. 09/849,810 entitled "System And Method For Hierarchical Policing Of Flows And Subflows Of A Data Stream," filed on May 4, 2001, which are assigned to the assignee of the instant application, the contents of which are incorporated herein by reference.

Referring briefly to FIG. 8, the exemplary main user interface screen 800 depicted the target hardware, which is an ingress processor 802 in this example. As previously described, the GPI supports GUI abstractions for visualizing three components within the ingress processor 802 shown in the presentation space view 805, including the parser 804, policer 806, and editor 808. The creation of subroutines for the parser 804 was described above. The following description describes the various policer setup screens which allows the developer to configure the policer 806.

Figure 23:
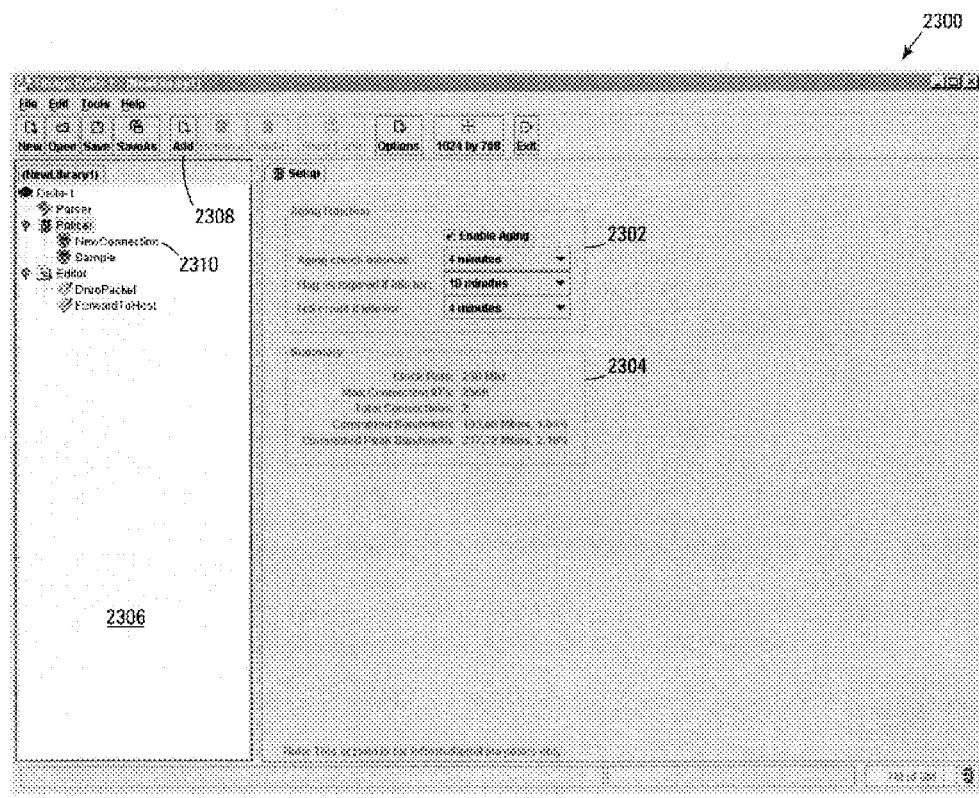
FIG. 23 illustrates an exemplary main policer screen.

The policer 806 can be selected to reveal user interface screens to program the policer and policer entries. The policer screens are for informational purposes in the illustrated embodiment, and the API will create policer entries at runtime using the parameter types displayed on these screens. FIG. 23 illustrates an exemplary main policer screen 2300 which can be presented by selecting the policer icon (e.g., policer 806 in FIG. 8), or can be selected in other manners such as by selecting the policer entry in the tree view. This main policer screen 2300 includes at least an aging function block 2302 and a summary block 2304. The aging function block 2302 allows for selection of various aging functions, such as the aging check interval, expiration idle time, and other aging functions. The summary block 2304 displays setup parameters and bandwidth utilization. As connections are added, the blocks 2302 and 2304 are updated.

New connections may be added to the policer via the policer screen 2300. New connections may be added in a variety of manners, including using the menu bar, tool bar, and/or the tree view. For example, the "policer" entry in the tree view 2306 can be highlighted, and either the add button 2308 can be selected, or a mouse device can be clicked (e.g., right-clicked) to present a pop-up menu to add a connection. When a new connection has been added, it is displayed in the tree view 2306, such as the "NewConnection" entry 2310. Connection names can be renamed if desired.

Figure 24:
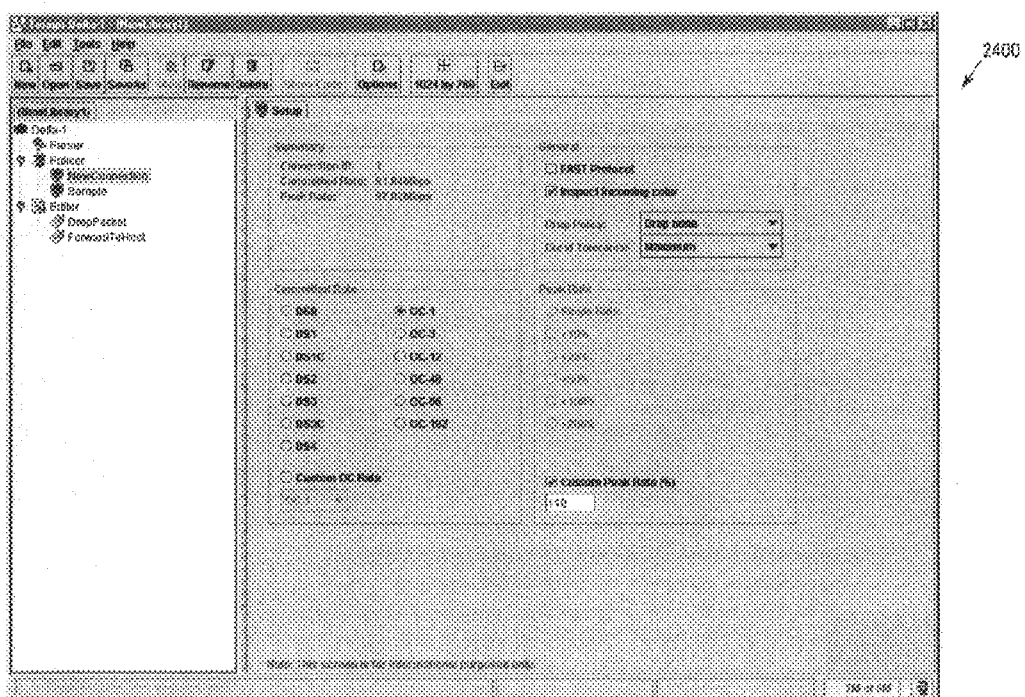
FIG. 24 is a connection settings screen that is presented when a connection is selected in connection with policer configurations.

FIG. 24 is a connection settings screen 2400 that is presented when a connection is selected. For example, selecting the "NewConnection" entry 2310 shown in FIG. 23 will present the connection settings screen 2400 of FIG. 24. This screen allows the user to configure the connection selected. Various drop-down menus, radio buttons, checkboxes, and other graphical entry and selection items are provided to allow configuration of the connection. In one embodiment of the invention, the connection settings screen 2400 is for informational purposes, and does not result in any exported program code.

Another aspect of the present invention relates to creation of editor subroutines. Recall that the editor performs the last operations on data packets before forwarding the packets to the slow path control plane and/or the switching fabric. The editor modifies packets based on editor subroutine and policing results. At run-time, the editor subroutines are fetched from a memory, such as an embedded or external SRAM, based on the search result connection ID returned by a CAM or TAG memory search in the parser. The subroutines generated by the editor can modify header fields, support policing results, and automatically update common fields, such as time to live (TTL). The realization and benefits of an editor module programmable in accordance with the present invention may be determined in a manner described herein and in copending U.S. patent application Ser. No. 09/849,804 entitled "System And Method For Providing Transformation Of Multi-Protocol Packets In A Data Stream", filed on May 4, 2001, which is assigned to the assignee of the instant application, the content of which is incorporated herein by reference.

The GPI/GUI editor feature in accordance with the present invention provides a graphical representation of the user-defined subroutines for the exemplary editor module described above, from which the GPI can export the subroutines to program code and/or configuration settings. In one embodiment of the invention, the GPI generates program code in C language.

Figure 25:
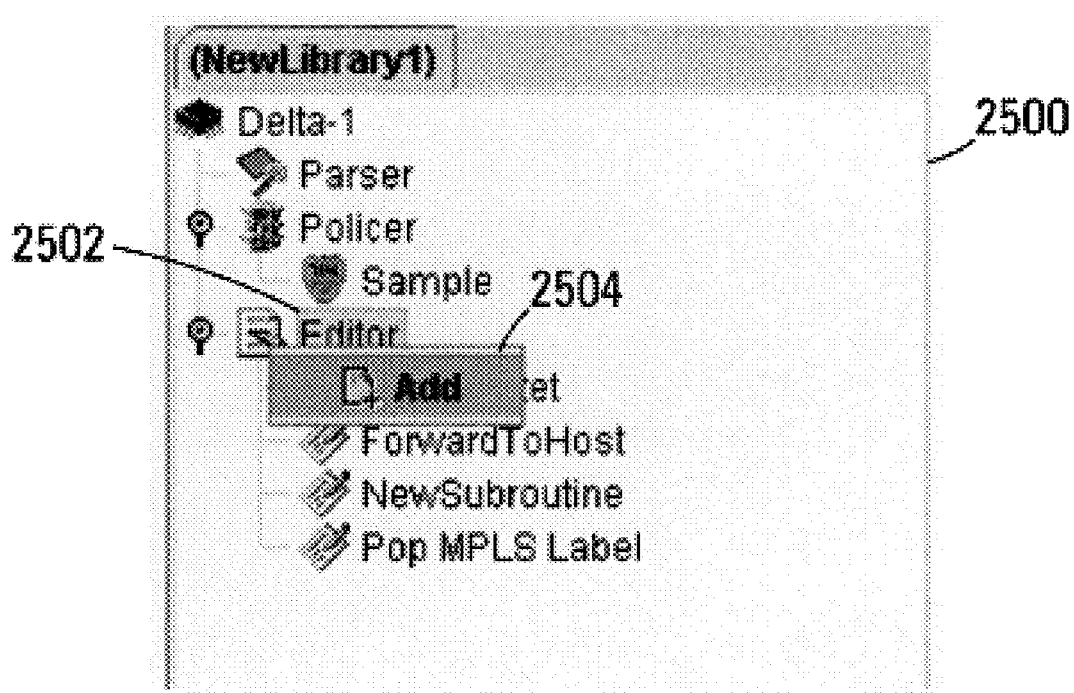
FIG. 25 illustrates an exemplary manner in which the user can initiate the addition of custom editor subroutines.
Figure 26:
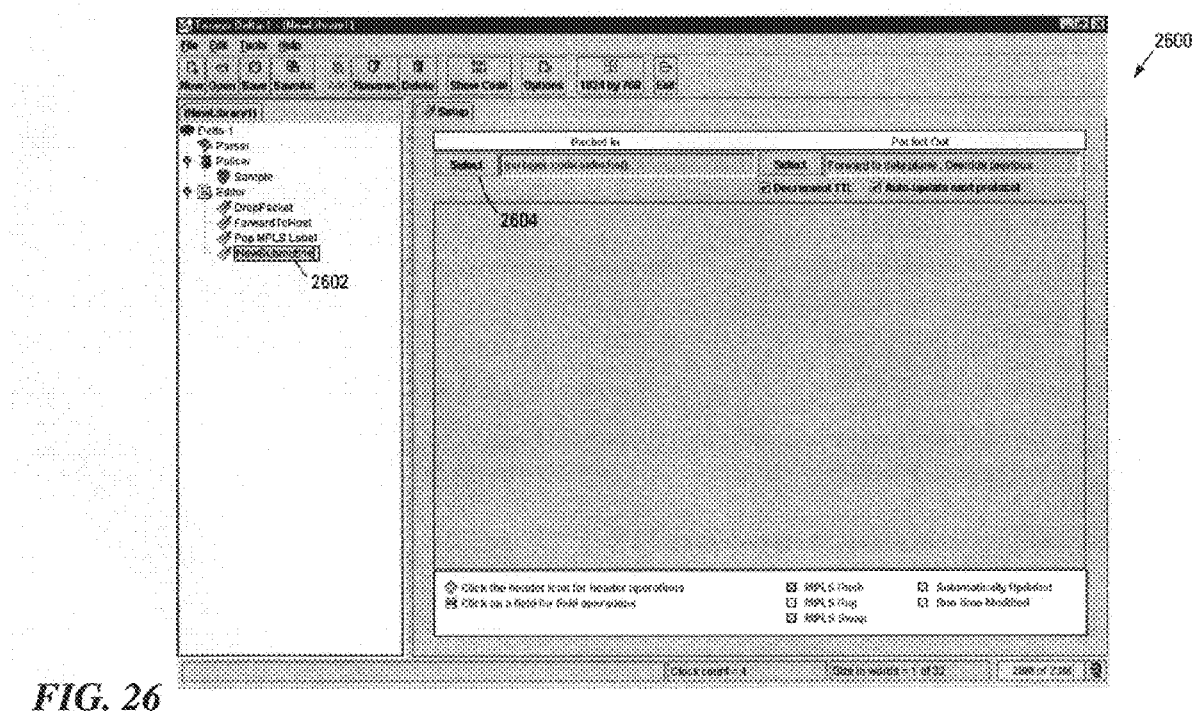
FIG. 26 illustrates an exemplary presentation space view of a blank editor setup screen.

As shown in FIG. 25, the user can initiate the addition of custom editor subroutines in various manners, such as by right-mouse clicking on the editor icon 2502 in the tree view 2500, and selecting the "Add" 2504 pop-up item. The user is then presented with a blank editor setup screen 2600 in the presentation space as shown in FIG. 26. An example of a created subroutine is shown as the "NewSubroutine" 2602 in FIG. 26. After a subroutine is created, it is configured to apply specified information from the packet-in protocol layers to the packet-out layers.

In order to configure the subroutine, the user selects a protocol layer code by selecting the "Select" 2604 button, and designating the appropriate protocols via pop-up menus in a manner similar to the protocol menu selection described in connection with the parser in FIG. 9. The subroutine thus created applies only to those packets having a protocol stack described by the selected protocol layer code. Once the layer code has been defined, the user is presented with a graphical representation of the protocol header stack as it appears before and after editing operations. An exemplary embodiment of a graphical representation of the protocol header stack is shown in FIG. 27.

Figure 27:
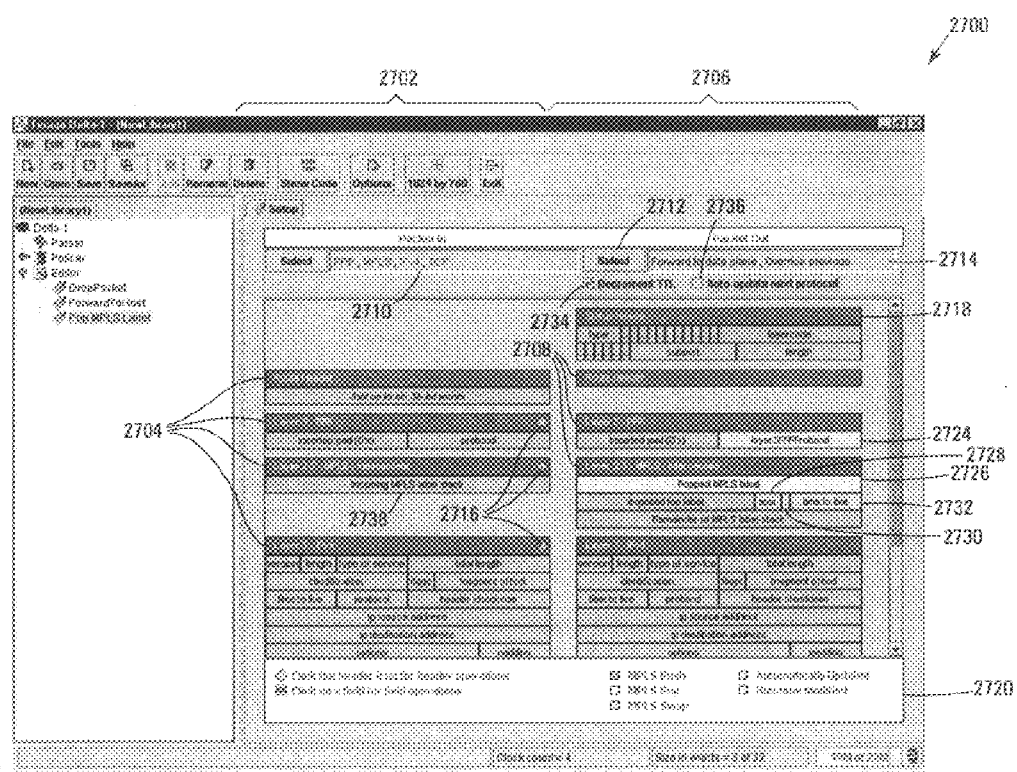
FIG. 27 illustrates an exemplary embodiment of a graphical representation of the protocol header stack in connection with an editor function.

Referring to FIG. 27, the editor setup screen 2700 in the presentation space view graphically displays modifications performed on protocol headers. The left side of the editor setup screen 2700 is labeled "Packet In" 2702, and the various protocol headers 2704 on this side are depicted as they appear prior to editing. The right side of the editor setup screen 2700 is labeled "Packet Out" 2706 and provides a graphical representation of the desired output header 2708 configurations after the editor subroutine has been applied. The layer code to which this subroutine applies may be displayed in the text field 2710. In this example, the subroutine applies to packets having a PPP/MPLS/IPv4/TCP protocol stack.

Using the "Select" 2712 button on the "Packet Out" 2706 side, the user can choose various actions that define how the packet will be forwarded, and how the subroutine will be applied. The packet can be dropped or forwarded to the data plane and/or host. The user can also define how the editor subroutine interacts with previous editor subroutines that may apply to this layer. Interaction with previous subroutines may include ignoring the current action, overriding the previous action, or performing a logical AND/OR with the previous action. In the illustrated example, the packet is forwarded to the data plane, and the previous action is overridden. This action is indicated by the "Forward to data plane, override previous" label in the "Packet Out" text field 2714.

The user defines field editor operations by selecting GPI elements on the "Packet In" headers 2704. Operations such as removing a protocol header or changing the protocol for a given layer can be chosen from a menu that appears by selecting the diamond icon 2716 at the title bar of a protocol header 2704. Another operation that can be performed using the menu presented upon selection of the diamond icon 2716 is to set the layer to a wildcard layer. Use of a wildcard layer allows the indicated editor operation to be performed on any protocol stack that fits the description set by the non-wildcard layers. For example, an editor subroutine set for PPP, MPLS, IPv4, * has a layer 4 wildcard. This subroutine will be applied to all packets that have the layer-2, 2.5, 3 arrangement of PPP/MPLS/IPv4. For example, such a subroutine would be applied to both PPP/MPLS/IPv4/TCP, and PPP/MPLS/IPv4/UDP. The subroutine would not, however, be applied to PPP/MPLS/IPv6/TCP, because layer-3 is not set to a wildcard value, and IPv6 does not correspond to the designated IPv4 in the given layer code.

In one embodiment using wildcard operations, the graphical representation of wildcard layer headers are removed from the editor screen 2700 for this layer. This is because the header configuration is indeterminate, as any number of protocols may fit the wildcard. In the extreme case, a wildcard layer code of *, *, *, * will show no protocol headers. A subroutine that utilizes the *, *, *, * layer code may be applied to all packets. The only graphical information that will appear for a wildcard layer code of *, *, *, * is the Status Header 2718, which is prepended to all processed packets in this exemplary system.

The graphical representation of the output protocol headers 2708 on the "Packet Out" 2706 side reflects automatic and run-time data field modifications. In one embodiment, modified data fields are presented in a different color, and the text label within the field may change. The color of a modified field in a "Packet Out" header 2708 is coded depending on the type of action. A legend 2720 on the editor screen 2700 shows the color codes for various options.

The modified graphical view of headers between "Packet In" 2702 and "Packet Out" 2706 sides allows the user to instantly view the extent of editor subroutine actions. For example, in FIG. 27, the user can see that the PPP protocol field 2722 is modified by the run-time "layer2PPPProtocol" function 2724, the MPLS label 2726 is popped, and the exp field 2728, bottom of stack field 2730, and TTL field 2732 are automatically updated. The manner in which these changes are effected is described more fully below.

Certain data operations, such as decrementing the TTL field 2732, are processed automatically as a convenience to the user. In one embodiment, these actions will be presented by default in the graphical views, although the user has the option to disable these automatic operations. For example, checkboxes may be provided to allow the user to selectively disable automatic operations, such as the "Decrement TTL" checkbox 2734 and the "Auto-update next protocol" checkbox 2736, which can enable and disable automatic data updates.

In accordance with the invention, custom, run-time data operations can be defined by the user. In FIG. 27, the illustrated editor subroutine handles MPLS protocol packets and may operate on a non-edge MPLS router. In this case, the MPLS headers are intermediate, and certain operations such as a push or pop from the MPLS label stack can be performed on the Layer 2.5 header to update the MPLS header between network nodes. In the illustrated example, an MPLS label is popped, and the user can visualize the modification to the Layer 2.5 header on the "Packet Out" 2706 as a result of the MPLS label pop. For example, the MPLS header in the "Packet In" side 2702 shows the incoming MPLS stack 2738. On the "Packet Out" side 2706, the popped label 2726 is displayed at the top of the header, and the exp field 2728, bottom of stack field 2730, and time to live field 2732 in the MPLS header are automatically modified.

The user may create user defined modification functions on selected fields as well. For instance, in FIG. 27, a customized update has been made to the Layer 2 header, in particular the protocol field 2722 of the PPP header. The "Packet Out" view 2706 indicates that the protocol field 2724 has been changed, and that a run-time variable named "layer2PPPProtocol" contains the data that will be used to modify this field.

Figure 28A:
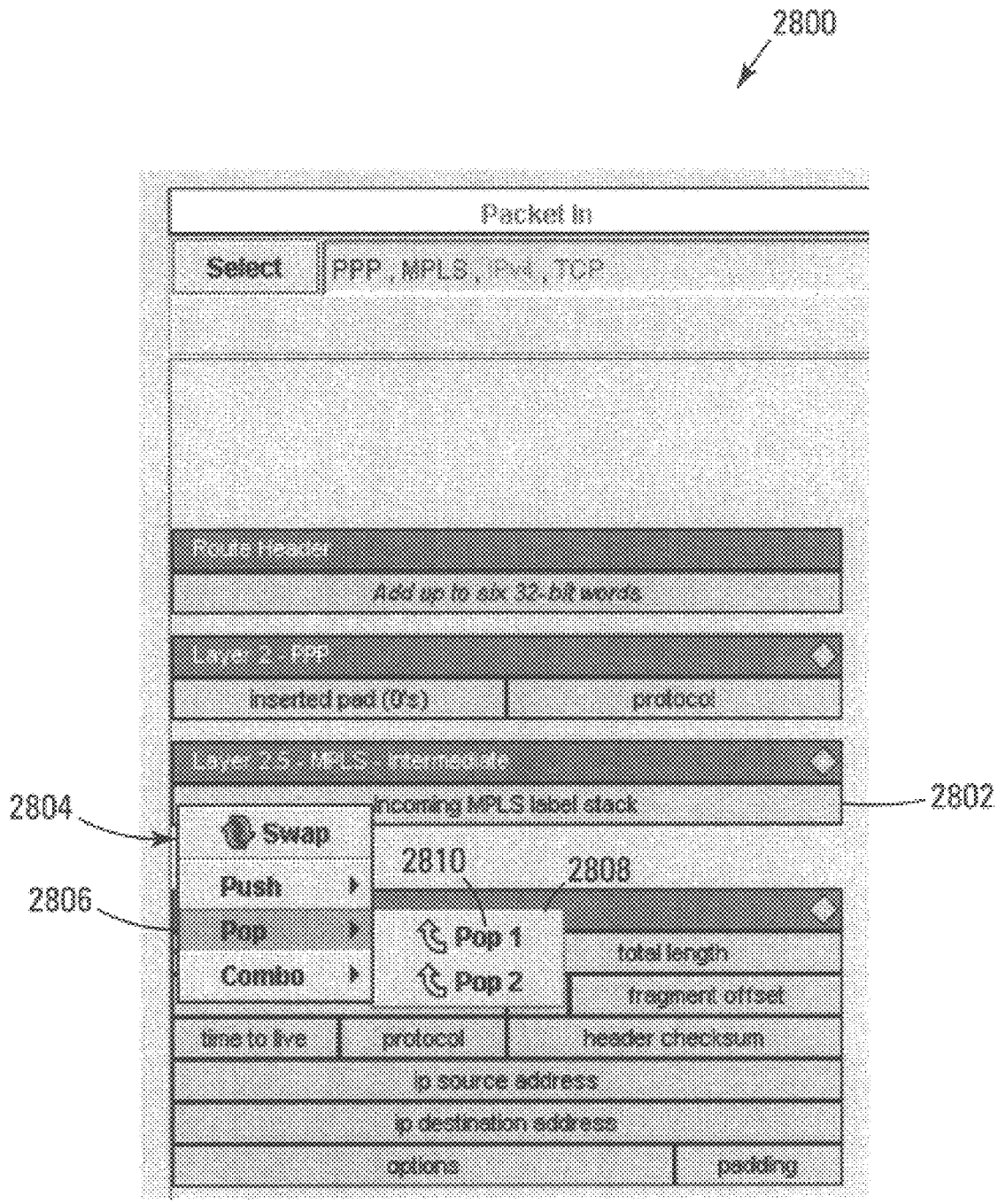

FIGS. 28A, 28B, and 28C provide an example of how an input packet may be graphically modified to provide a desired output packet. Performing the graphical manipulations of packet header fields described below results in the generation of program code that will ultimately cause the editor module of the ingress processor to carry out the graphically-generated packet transformations. In other words, as a result of the graphical packet header manipulations facilitated by the present invention, program code will be generated to effect such packet modifications at run-time. The generated program code is downloaded to a memory device (e.g., SRAM 416A or 416B of FIG. 4) that operates in connection with the editor, and that is appropriately indexed using the search results generated by the parser component of the ingress processor. While any desired type of packet modifications can be effected in the manner described below, one particular example is provided in FIGS. 28A, 28B, and 28C for purposes of illustration.

Referring first to FIG. 28A, the layer-2.5, MPLS layer is considered. Assume that it is desired to pop the current top MPLS label of the incoming packets associated with the designated packet type (e.g., PPP/MPLS/IPv4/TCP). This is accomplished by selecting the "incoming MPLS label stack" field 2802 on the "packet-in" side 2800 of the display. This selection may be made in a variety of ways, including right-mouse clicking on the field 2802, which presents a pop-up menu 2804. The menu 2804 provides the user with various editing options that can be performed on the incoming MPLS label stack 2802, including a swap function, a push function, a pop function, or a combination of swap, pop, and push functions. If the user desires to pop the current top MPLS label, the "Pop" menu item 2806 is selected. This presents another pop-up menu 2808 that presents various label pop options, including selectable options as to the number of current MPLS labels that will be popped. If the user desires to pop only one MPLS label, the user selects the "Pop 1" menu item 2810. The user has therefore graphically defined the desired modification of the incoming MPLS label stack 2802 for PPP/MPLS/IPv4/TCP packets.

Referring now to FIG. 28B, the packet-out display 2820 is shown prior to the modifications designated on the packet-in display 2800 described in FIG. 28A. The layer 2.5, MPLS layer 2822 is shown with five fields, including the "incoming top label" field 2824, the "exp" field 2826A, the "bottom of stack" field 2828A, the "time to live" field 2830, and the "remainder of MPLS label stack" field 2832 representing an indeterminate number of remaining MPLS labels. When the user has designated the modifications as described in FIG. 28A, the packet header fields in the packet-out display 2820 change, as shown in FIG. 28C. The layer 2.5, MPLS layer 2822 now includes a new field, shown as the "Popped MPLS label" field 2834. The other fields remain, although the "exp" field 2826B and "bottom of stack" field 2828B have been modified in view of the pop action designated. In other words, the contents of the fields 2826B and 2828B change because of the MPLS pop action. Modifications to other fields may be made in an analogous manner.

As can be seen from the foregoing example, the user is allowed to graphically define actions to be taken on the incoming packets, and the outgoing packets are automatically updated accordingly. Program code is generated to cause the actual packet modification at run-time.

The data model/code generator in accordance with the present invention performs the functions required to bridge the GPI user input and the resulting program code, configuration parameters, and/or any other data that may be used to prepare the target device for operational use. In one embodiment, the GPI and data model/code generator are provided via software modules that recognize GUI inputs and transform the GUI inputs into the program code and configuration parameters that ultimately "program" the target device. Exemplary manners of providing these software modules are provided below.

As previously described, one task required for programming the ingress parser is building search keys for the content-addressable memory (CAM). Certain data are extracted from an incoming header and the data is combined into one or more search keys having lengths from 32 to 256 bits. The search key is placed on the CAM data bus, and the result of the CAM lookup is a tag memory address resulting in an n-bit (e.g., 36-bit) search result that is used in further processing the packet.

Building a search key may require extracting data from headers, performing Boolean operations or comparisons on the data, and placing the data and Boolean/comparison results into a search key. The code that performs placement of data into a search key typically requires extracting the data from the header using a mask, offsetting the extracted data and performing a logical OR to set the correct bits in the search key. For setting a result bit of a Boolean/comparison operation, the Boolean/comparison operation is performed on the appropriate header field, and the result bit is then placed in the search key at the appropriate offset. In prior art software development environments, the engineer must calculate the correct extraction masks, bit shifts and Boolean/comparison operations to be performed on the header data as it is set into the search key. This process can be time consuming, and is prone to human error.

In the following description of an exemplary embodiment of the present invention, the software used to accomplish particular tasks is described using object-oriented (OO) terminology. In particular, a class is used to describe a functional unit within the code, and an object is used to describe an instantiation of a class. The use of OO terminology is well known in the art, and OO designs can be readily implemented in such languages as C++ and Java. It is assumed that an embodiment of the present invention is not restricted to the use of an OO language or OO design principles, and that using OO principles is merely a convention that aids the reader in understanding the invention.

In one embodiment of the present invention, the header data and search keys as previously described are abstracted to visual and domain classes. The visual classes display the underlying data as graphical elements in a manner familiar to the user. In this example, the visual classes can present blocks of binary data as rectangular blocks on the GPI/GUI. The representation of bit patterns as rectangular blocks is a typical representation, and the abstraction is easily understood by network systems designers.

The domain classes are functional classes and are not visible to the user. The domain classes contain the actual data to be manipulated and may also contain methods to access and manipulate the underlying data. The methods contained within the domain classes typically capture behaviors understood by domain experts. The visual classes typically contain a reference to an associated domain class, and the visual classes set and update visual parameters based on values contained within the domain classes.

Figure 29:
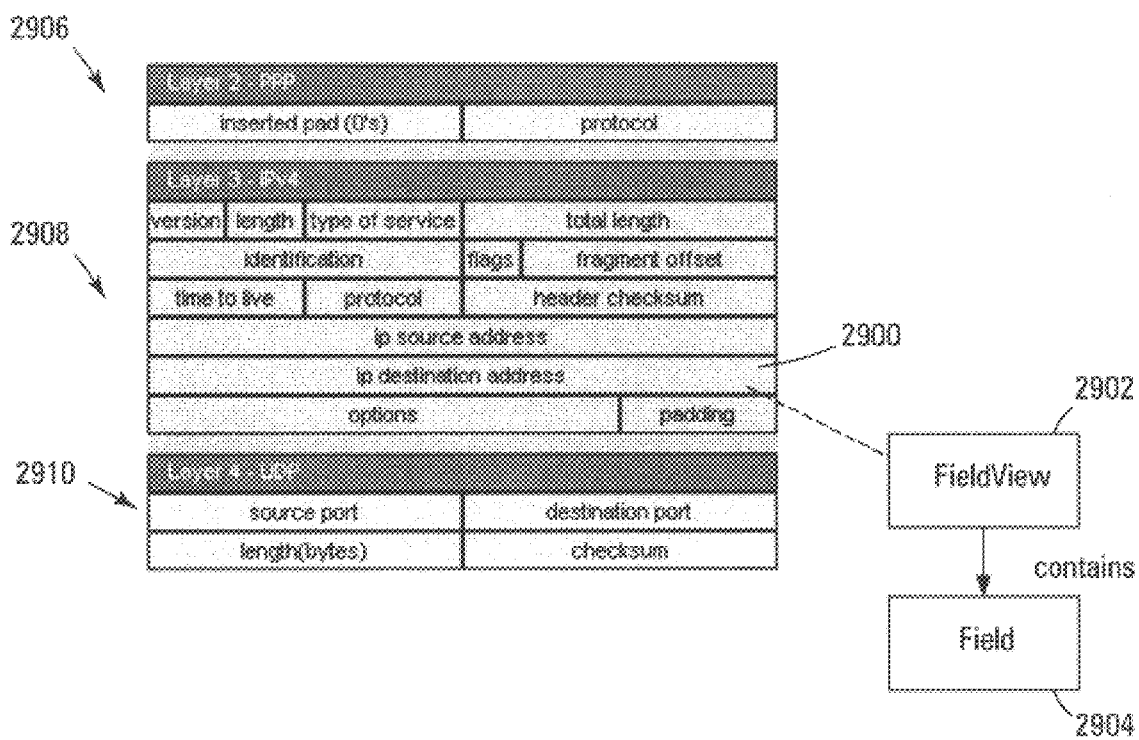
FIG. 29 illustrates an example of how domain and visual classes can be illustrated by a header field such as the IP destination address field.

An example of domain and visual classes can be illustrated by a header field such as the IP destination address field 2900 shown in FIG. 29. The actual field to be manipulated by the generated code in the target system is a series of bits in a binary storage device, such as an SRAM. The abstracted field is represented by a visual class referred to herein as the FieldView 2902, and is displayed to the user as an elongated rectangle with the "ip destination address" label at its center. The FieldView 2902 object draws the rectangle in an appropriate location within the header graphic that corresponds to the bit offset of this field as defined by the IPv4 protocol. The FieldView 2902 object contains a reference to a domain object, Field 2904. A Field 2904 object can include data values such as the field bit width, bit offset within the header, field name, OSI layer, etc. The FieldView 2902 object uses the data contained within the Field 2904 object for certain visual characteristics needed for display. For example, the width of the rectangle drawn by FieldView 2902 is proportional to the bit-length of the Field 2904 object.

The association between the FieldView 2902 and Field 2904 objects allows the visual display to reflect the underlying domain data. Another beneficial aspect of this association is that the FieldView 2902 can be manipulated by a user, and therefore the user can make changes to the underlying domain object with user actions within the GUI. The changing of a domain object based on graphical user input to a visual object allows a system according to the present invention to perform complex transformations of domain data based on graphical manipulations. The transformation of data is hidden behind a graphical abstraction that is simple and natural for the user to manipulate.

Figure 30:
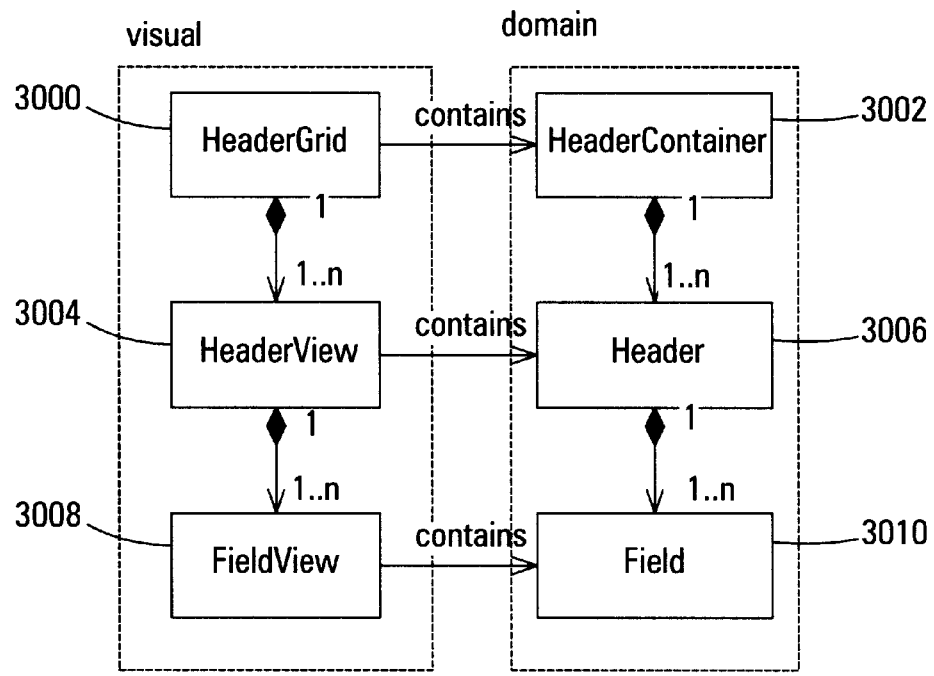
FIG. 30 illustrates a relationship of visual and domain classes used in building a search key.

An example where visual and domain classes are used for the generation of code according to an embodiment of the present invention will now be described. In this example, a parser search key is built from extracted header data specified by the user. Turning to FIG. 30, a relationship of visual and domain classes used in building a search key is illustrated. A visual class referred to as a HeaderGridView 3000 contains a reference to a domain object referred to as a HeaderContainer 3002. The HeaderGridView 3000 contains an ordered collection of HeaderView 3004 visual objects. The HeaderContainer 3002 is an ordered collection of Header 3006 domain objects.

The HeaderView 3004 is composed of one or more FieldView 3008 visual objects. The HeaderView 3004 contains a reference to a Header 3006 domain object. The Header 3006 contains a collection of Field 3010 domain objects. The FieldView 3008 contains an associated Field 3010 domain object.

Referring back to FIG. 29, the HeaderGridView 3000 of FIG. 30 is drawn as the stack of protocol headers 2906, 2908, 2910 corresponding to OSI layers 2, 3 and 4. If MPLS was defined as part of the protocol stack, then there can be an additional header drawn relating to OSI layer 2.5. The HeaderGrid 3000 has an associated HeaderContainer 3002 domain object that is created based on a layer code selected by the user when creating the parser subroutine. The layer code can be represented as a string, such as PPP/None/IPv4/UDP. The HeaderContainer 3002 is dynamically created by a factory object using the layer code string. Those skilled in the art will recognize that the factory class is a design pattern used for creating specific objects containing a commonly inherited interface. In this manner, the present invention can be made extensible to any number of protocol arrangements without significant modification of existing code. The benefits of factory patterns are discussed in great detail in Design Patterns: Elements of Reusable Object-Oriented Software by Erich Gamma, Richard Helm, Ralph Johnson, and John Vlissides (Addison Wesley. October 1994).

The HeaderGrid 3000 constructs graphical representations of protocol headers based on the domain information contained in the HeaderContainer 3002. The graphical representation of the protocol headers as seen in FIG. 29 are drawn by HeaderView 3004 visual objects. The layer-3 header (IPv4) 2908 from FIG. 29 is an example of what is drawn by a HeaderView 3004 object. The HeaderView 3004 draws a sequentially arranged set of boxes representing the fields within header, plus a title block at the top. The title block indicates the protocol and OSI layer the header corresponds to. The boxes representing data fields within the HeaderView 3004 object are drawn by FieldView objects 3008.

The "ip destination address" box 2900 within the layer-3 header in FIG. 29 is an example of what is drawn by a FieldView object 3008. The FieldView 3008 objects appear as rectangles having width proportional to the bit width of the associated Field 3010 domain object. The FieldView object 3008 also displays a label which allows the user to easily identify the field by its functional name. The size and arrangement of FieldView 3008 objects within the HeaderView 3004 corresponds to the established data format of the corresponding protocol header.

In the GUI depicted in FIG. 13A, for example, the boxes drawn by the FieldView 3008 objects are selectable by the user. The user can select and move a FieldView 3008 box into a search key 1318 using a cursor in a graphical operating system. In a manner similar to the header field classes, the search key 1318 is abstracted into visual and domain classes as well.

Figure 31:
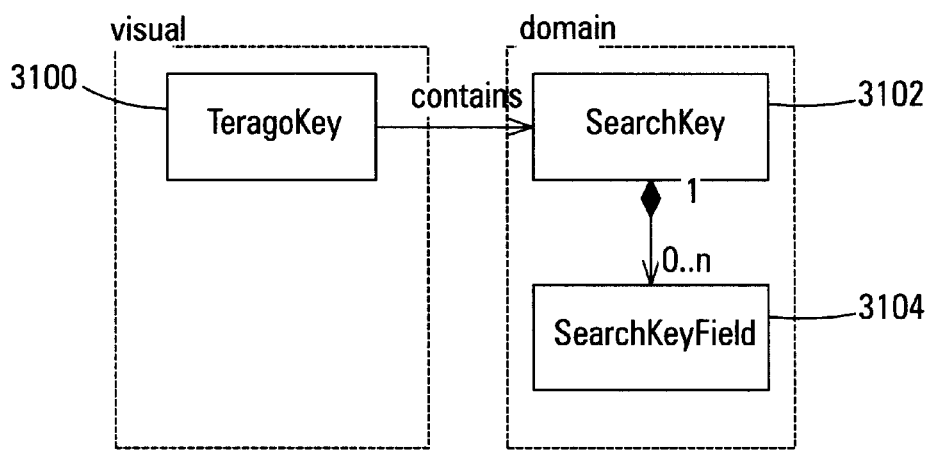
FIG. 31 illustrates exemplary visual and domain classes that define the search key.

The search key 1318 appears on the GUI as a rectangle with tick marks indicating bit boundaries within the search key. The visual and domain classes that define the search key are illustrated in FIG. 31. The TeragoKey 3100 is the visual class which displays the search key on the GUI. The TeragoKey 3100 object contains a reference to a SearchKey 3102 domain object. The SearchKey 3102 contains zero or more SearchKeyField 3104 objects. The SearchKeyField 3104 is a domain object created by user interaction between FieldView 3008 and TeragoKey 3100 visual objects.

The user can use the visual objects to build search keys in a manner similar to a painter using a pallet and canvas. The "pallet" for choosing fields is the HeaderGrid 3000. The FieldView 3008 objects are analogous to the different colors of "paint" on the pallet, and the TeragoKey 3100 corresponds to the "canvas." The user selects a FieldView 3008 object and drags it onto a TeragoKey 3100 object. Once the user releases the FieldView 3008 object, an event is passed to the TeragoKey 3100 by the graphical subsystem. The event informs the TeragoKey 3100 that a FieldView 3008 object was released at a particular window coordinate within the TeragoKey's graphical window. The TeragoKey 3100 can convert this window location to a bit offset within the search key. The TeragoKey 3100 also queries the FieldView 3008 to extract domain information from the Field 3010 object that is contained within the FieldView 3008 object.

The TeragoKey 3100 passes the Field 3010 domain information to an internally referenced SearchKey 3102 domain object. Based on the graphically calculated bit offset and the Field 3010 domain data, the SearchKey 3102 can create a SearchKeyField 3104 object and add the new SearchKeyField 3104 object to an internal collection. A SearchKeyField 3104 is constructed from a Field 3010 and internalizes certain useful data from the Field 3010 (header offset, field width, etc.) in a format useful for the functions performed by the SearchKey 3102. The SearchKey 3102 contains the logic to convert all of its SearchKeyField 3104 objects to executable code for the parser.

The operations that can be performed by SearchKey generated code include extracting header fields, offsetting the extracted fields within the key, and logically OR'ing the field into the key. As these extraction and offset operations are well defined and ordered, the SearchKey 3102 can consistently generate accurate code based on the user actions that created interactions between the FieldView 3008 and TeragoKey 3100 classes.

The SearchKey 3102 object can also provide the data needed by the TeragoKey 3100 to visually display the extracted header field within the search key. After the SearchKeyField 3104 has been created, the user will see a corresponding colored rectangle superimposed on the bit-field of the TeragoKey 3100. The SearchKeyField 3104 rectangle will have a label corresponding to the Field 3010 object from which the SearchKeyField 3104 was constructed. This gives visual feedback that the named header field has been added to the search key, and also informs the user of the bit offset of the extracted field within the search key.

The large number of protocol stacks, header fields, key widths, and bit offsets within the keys can combine into an astronomical number of potential parser key extraction functions. A system according to the present invention can assure that the user can easily and reliably generate code to perform a desired subset of those extractions. The visual feedback gives the user assurance that the application domain knowledge has been applied correctly, e.g. the correct field is placed in the correct key offset. The mechanical code generation of the domain classes can assure that the generated code will be correct and free from programming errors. In this way, the present invention can perform a complex and high level task based on a nearly infinite, but easily visualized, set of data manipulation operations.

A system according to the present invention can provide further benefits that will be apparent to those skilled in the art from the description provided herein. For example, the generated code from the SearchKey class 3102 is based on well-defined extraction and offset coding rules. An expert in the underlying destination machine architecture can predict the performance of the code for any given extraction key. For example, an extraction of a destination IP address header into the lower 32-bits of a 64-bit key can be performed by a predictable sequence of masking, assignment and Boolean/comparison operations from a header buffer into a key buffer. The SearchKey 3102 class can include, for example, a method called getClockCounts( ) which returns the predicted processor clock cycles of the extractions defined within a SearchKey 3102 object as built by the user. The getClockCounts( ) method is particularly useful for a number of reasons.

For example, placing of extracted header fields into a search key is typically more efficient when the extracted fields are placed on byte boundaries of the search key. Otherwise, the extracted data must be placed in multiple word buffers and bit shifted, which adds expensive processor instructions to the procedure. The SearchKey 3102 class can perform an internal optimization of a SearchKeyField 3104 collection by iterating through the all available bit offsets for the SearchKeyFields 3104, and select an offset that results in the lowest clock count. This optimization of offsets locations can be performed on any number of extracted fields that are placed within the search key.

The ability to predict system performance based on a visual data transformation model built by the user has other advantages from a system design perspective. In a prior art method, the data transformation code is written and compiled, and must be tested on target hardware to assure that performance requirements are met. If the performance requirements are not met, then the code must be modified and another set of tests performed. This cycle of test and re-coding is a well known inhibitor to reducing development cycle time. The inability to predict system performance also adds an element of risk to the design, as the system designers have little a priori assurance that the system design can meet performance goals until late in the development process.

Using practices according to the present invention, the system performance can be accurately predicted well before hardware testing begins. The code generated by the SearchKey 3102 objects, for example, contains performance information for the target instruction set. The performance information for all the search keys and editing subroutines in the library can be combined to obtain a system level performance measurement. The system parameters (e.g. processor clock speed, bus speed, available memory, etc.) are then combined with the predicted execution speed of the generated code to predict total system performance in key areas, such as data throughput. In this manner, a user can predict and fine tune the system performance early in the design process without relying on expensive hardware testing cycles.

Those skilled in the art can appreciate from the description provided herein how the present invention can significantly reduce initial development time. For example, the ability to visualize data fields, bit locations, and masks can give the user positive visual feedback that the desired fields are being manipulated correctly. Visualizing the data transformation operations allows the user to much more quickly spot domain-type errors (e.g. extracting the wrong header fields, placing extracted fields at the wrong bit offset within the key) than can be done by examining source code. Also, a system according to the present invention is easily amenable to change. Visual manipulation of data representation is easier to perform, and much less prone to error than the text editing required when changing source code manually.

Although the visualization of data as bit-packed structures described in these examples is useful for the network data processing domain, it can be appreciated that a system according to the present invention can use other visual abstractions just as effectively. For example, a system that transforms tables entries between incompatible database systems can represent data in the form of graphical tables. The graphical tables can represent the database schema tables. Such a system could generate instructions to transfer information between databases based on a user dragging row entries between graphical tables.

Figure 32:
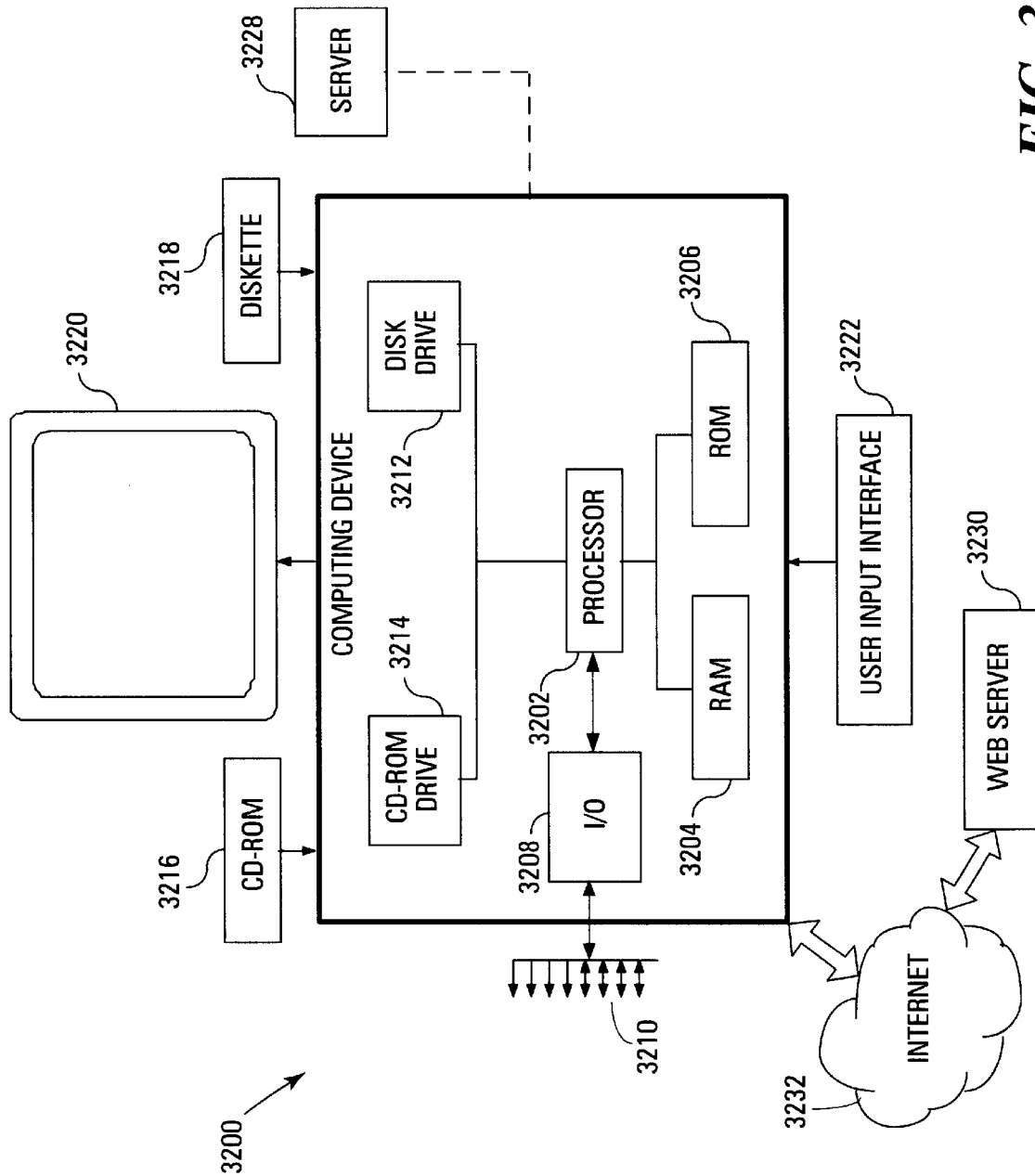
FIG. 32 illustrates an exemplary computing structure that can be used in connection with the present invention to carry out the various operations of the invention.

Hardware, firmware, software, or a combination thereof may be used to perform the various functions/operations and to display the presentations described herein. The functional modules used in connection with the invention may reside in any computing system capable of executing the functions associated with the invention. The computing structure 3200 of FIG. 32 is an example computing system that can be used in connection with the present invention to carry out the various operations of the invention. For example, the computing structure 3200 is a representative example of a computing system 210 shown in FIG. 2, the processor module 330 shown in FIG. 3, or the CPU 420 shown in FIG. 4.

The example computing arrangement 3200 suitable for performing the graphical programming functions in accordance with the present invention typically includes a central processor (CPU) 3202 coupled to random access memory (RAM) 3204 and some variation of read-only memory (ROM) 3206. The ROM 3206 may also be other types of storage media to store programs, such as programmable ROM (PROM), erasable PROM (EPROM), etc. The processor 3202 may communicate with other internal and external components through input/output (I/O) circuitry 3208 and bussing 3210, to provide control signals, communication signals, and the like.

The computing arrangement 3200 may also include one or more data storage devices, including hard and floppy disk drives 3212, CD-ROM drives 3214, and other hardware capable of reading and/or storing information such as DVD, etc. In one embodiment, software for implementing the graphical programming tool in accordance with the present invention may be stored and distributed on a CD-ROM 3216, diskette 3218, or other form of media capable of portably storing information. These storage media may be inserted into, and read by, devices such as the CD-ROM drive 3214, the disk drive 3212, etc. The software may also be transmitted to the computing arrangement 3200 via data signals, such as being downloaded electronically via a network such as an intranet or the Internet. Further, as previously described, the software for carrying out the functions associated with the present invention may alternatively be stored in internal memory/storage of the computing device 3200, such as in the ROM 3206. The computing arrangement 3200 is coupled to a display 3220, which represents a display on which the graphical user interface in accordance with the invention is presented. The display 3220 merely represents the "presentation" of the graphical information in accordance with the invention and may be any type of known display or presentation screen, such as LCD displays, plasma display, cathode ray tubes (CRT), etc. Where the computing device 3200 represents a stand-alone or networked computer, the display 3220 may represent a standard computer terminal or display capable of displaying multiple windows, frames, etc. A user input interface 3222 such as a mouse or keyboard may be provided where the computing device 3200 is associated with a standard computer. Other user input interface devices include a keyboard, a mouse, a microphone, a touch pad, a touch screen, voice-recognition system, etc.

The computing arrangement 3200 may be connected to other computing devices, such as connected via a network. The computing arrangement 3200 may be connected to a network server 3228 in an intranet or local network configuration. The computer may further be part of a larger network configuration as in a global area network (GAN) such as the Internet. In such a case, the computer accesses one or more web servers 3230 via the Internet 3232.

Using the foregoing specification, the invention may be implemented as a machine, process, or article of manufacture by using standard programming and/or engineering techniques to produce programming software, firmware, hardware or any combination thereof.

Any resulting program(s), having computer-readable program code, may be embodied within one or more computer-usable media such as memory devices or transmitting devices, thereby making a computer program product or article of manufacture according to the invention. As such, the terms "article of manufacture" and "computer program product" as used herein are intended to encompass a computer program existent (permanently, temporarily, or transitorily) on any computer-usable medium such as on any memory device or in any transmitting device.

Executing program code directly from one medium, storing program code onto a medium, copying the code from one medium to another medium, transmitting the code using a transmitting device, or other equivalent acts may involve the use of a memory or transmitting device which only embodies program code transitorily as a preliminary or final step in making, using, or selling the invention.

Memory devices include, but are not limited to, hard disk drives, diskettes, optical disks, magnetic tape, and semiconductor memories such as RAM, ROM, PROMS, etc. Transmitting devices include, but are not limited to, the Internet, intranets, telephone/modem-based network communication, hardwired/cabled communication network, cellular communication, radio wave communication, satellite communication, and other stationary or mobile network systems/communication links.

A machine embodying the invention may involve one or more processing systems including, but not limited to, CPU, memory/storage devices, communication links, communication/transmitting devices, servers, I/O devices, or any subcomponents or individual parts of one or more processing systems, including software, firmware, hardware, or any combination or subcombination thereof, which embody the invention as set forth in the claims.

From the description provided herein, those skilled in the art are readily able to combine software created as described with appropriate general purpose or special purpose computer hardware to create a computer system and/or computer subcomponents embodying the invention and to create a computer system and/or computer subcomponents for carrying out the method of the invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for programming a programmable circuit, comprising:

facilitating graphical definition of at least one type of input data unit that is expected to be received at the programmable circuit;

presenting a visual representation of an input data format corresponding to the defined type of input data unit;

facilitating graphical manipulation of the visual representation of the input data format to graphically transform the input data format to a visual representation of a desired output data format of output data units to be output from the programmable circuit; and automatically generating program code for directing the programmable circuit at run-time deployment to transform actual input data units of the defined type of input data units to actual output data units having the desired output data format in a manner corresponding to the graphical transformation of the visual representations of the input data format to the desired output data format.

2. The method of claim 1, wherein facilitating graphical manipulation of the visual representation of the input data format comprises enabling graphical user selection and identification of desired field modifications of information fields associated with the input data format.

3. The method of claim 2, further comprising presenting selectable options for the user to graphically identify the desired field modifications for particular information fields.

4. The method of claim 1, wherein facilitating graphical definition of a type of input data unit comprises facilitating graphical definition of a protocol stack corresponding to the input data unit, where in the protocol stack comprises one or more protocol layers.

5. The method of claim 4, wherein presenting a visual representation of an input data format comprises displaying the protocol stack and associated protocol layers, and further comprising displaying one or more header fields associated with the one or more of the protocol layers.

6. The method of claim 1, wherein facilitating graphical manipulation of the visual representation of the input data format further comprises facilitating graphical transformation of the input data format and one or more intermediate data formats to the visual representation of the desired output data format.

7. The method of claim 1, further comprising:
facilitating graphical generation of one or more memory search keys via graphical inclusion of one or more information fields of the input data format into the memory search keys; and
automatically generating program code for directing the programmable circuit at run-time deployment to extract actual information fields from the input data units to form actual memory search keys corresponding to the graphically generated memory search keys, and for directing the programmable circuit at run-time deployment to index a target memory using the actual memory search keys.

8. The method of claim 7, wherein facilitating graphical generation of the memory search keys comprises enabling drag-and-drop entry of the information fields of the input data format into a visual representation of the memory search keys.

9. The method of claim 8, wherein enabling drag-and-drop entry comprises enabling the information fields to be dragged and dropped at any desired bit-range subset of an n-bit set of bits comprising the memory search keys.

10. The method of claim 8, further comprising adjusting a location of the information fields dragged and dropped into the memory search keys to decrease a number of programmable circuit clock cycles required of the generated program code at run-time deployment to index the target memory using the search keys.

11. The method of claim 10, wherein decreasing the number of programmable circuit clock cycles comprises reducing a number of instructions automatically generated to index the target memory using the search keys.

12. The method of claim 10, wherein adjusting a location of the information fields comprises automatically adjusting the location of the information fields in response to a user selection of an automatic optimization option.

13. The method of claim 7, wherein facilitating graphical generation of one or more memory search keys comprises enabling graphical inclusion of a subset of the information fields to be extracted for inclusion into the memory search keys.

14. The method of claim 7, wherein facilitating graphical generation of one or more memory search keys comprises enabling graphical inclusion of at least one comparison field into the memory search keys, wherein the at least one comparison field comprises at least one bit to represent a result of a comparison of one of the information fields and an entered reference value.

15. The method of claim 14, further comprising facilitating graphical identification of the information field to be compared to the reference value.

16. The method of claim 7, further comprising enabling graphical definition of one or more conditional events that identify one or more of the memory search keys to the exclusion of one or more other ones of the memory search keys which is to be formed as the actual memory search keys at run-time deployment.

17. The method of claim 7, wherein facilitating graphical generation of one or more memory search keys comprises facilitating graphical generation of at least one second stage memory search key, wherein at least a portion of an output value expected to be output from the target memory as indexed by the memory search key is graphically included as at least a portion of the second stage memory search key.

18. The method of claim 1, wherein automatically generating program code comprises automatically generating the program code in real-time as the graphical manipulation of the visual representation of the input data format is performed.

19. The method of claim 1, wherein the input data unit is any transmittable data block having associated header information.

20. The method of claim 1, wherein the input data unit is one or more of a packet, a cell, or a frame.

21. The method of claim 1, further comprising facilitating manual, graphical optimization of the program code by presenting real-time, visual, program code efficiency feedback to a user.

22. The method of claim 21, wherein the code efficiency feedback is based on system throughput of the programmable circuit.

23. The method of claim 21, wherein the code efficiency feedback comprises at least a number of programmable circuit clock cycles required to carry out a particular one or more program code segments.

24. The method of claim 21, wherein the code efficiency feedback comprises at least a quantity of executable instructions required to carry out a particular one or more program code segments.

25. The method of claim 1, further comprising downloading the generated program code to one or more memory elements to store the generated program code for retrieval and use by the programmable circuit.

26. The method of claim 1, further comprising transforming the actual input data units to the actual output data units at run-time deployment of the programmable circuit.

27. The method of claim 1, further comprising:
facilitating graphical selection of one or more selectable configuration parameters for configuring the programmable circuit for operation; and
automatically formatting the configuration parameters for dispatch to the programmable circuit.

28. The method of claim 1, further comprising abstracting architecture-specific functionality of the programmable circuit into graphical programming application definitions to effect the facilitation of the graphical definition of the input data unit type, the presentation of the visual representation of the input data format, the facilitation of the graphical manipulation and corresponding graphical transformation, and the automatic generation of the program code.

29. The method of claim 1, wherein automatically generating program code comprises creating original program code based on the graphical transformation of the visual representations of the input data format to the desired output data format.

30. The method of claim 1, wherein automatically generating program code comprises selecting one or more predetermined software modules from a software module library based on the graphical transformation of the visual representations of the input data format to the desired output data format.

31. The method of claim 1, wherein automatically generating program code comprises creating original program code, and selecting one or more predetermined software modules from a software module library, based on the graphical transformation of the visual representations of the input data format to the desired output data format.

32. The method of claim 1, further comprising providing real-time feedback of a validity state of programmable objects, wherein the validity state identifies whether a particular programmable object may be generated as a portion of the program code.

33. The method of claim 1, further comprising facilitating graphical selection of configuration options to provide a particular visual representation of the input data format depending on the configuration option selected, and wherein facilitating graphical manipulation of the visual representation of the input data format comprises facilitating graphical manipulation of the particular visual representation of the input data format corresponding to the configuration option selected.

34. A method for programming a programmable circuit, comprising:

displaying a visual representation of at least one expected data protocol format for data packets that will be input to the programmable circuit;

providing a graphical user interface to allow a user to graphically edit one or more data fields associated with the visual representation of the expected data protocol format to produce a visual representation of a desired data protocol format for transformed data packets that are to be output from the programmable circuit; and automatically generating program code for use by the programmable circuit to transform the data packets that are received at the programmable circuit to the transformed data packets that are output from the programmable circuit, wherein a resulting transformation of the data packets at the programmable circuit corresponds to the graphical transformation effected via the graphical user interface.

35. The method of claim 34, wherein providing a graphical user interface further comprises facilitating graphical user definition of an expected data protocol stack having the expected data protocol format.

36. The method of claim 35, wherein facilitating graphical user definition of an expected data protocol stack comprises presenting a plurality of selectable protocol layer options each associated with a predefined protocol header format, and wherein the expected data protocol format comprises the predefined protocol header formats from each selected protocol layer option.

37. The method of claim 36, wherein:

providing a graphical user interface further comprises facilitating graphical selection of one or more header fields associated with the predefined protocol header formats for graphical creation of a visual representation of a memory search key; and automatically generating program code comprises generating at least a portion of the program code to create an actual memory search key corresponding to the visual representation of the memory search key at run-time deployment of the programmable circuit, wherein the actual memory search key is used to index a memory device to provide a corresponding memory output.

38. The method of claim 37, wherein the memory device is a content-addressable memory (CAM), and wherein the actual memory search key serves as content to identify an address to be output by the CAM.

39. The method of claim 38, wherein the address to be output by the CAM addresses a tag memory storing at least another portion of the automatically generated program code which causes the programmable circuit to transform the data packets that are received at the programmable circuit to the transformed data packets that are output from the programmable circuit.

40. The method of claim 37, further comprising providing real time validity feedback based on an underlying rules model of the programmable circuit, and wherein generating at least a portion of the program code to create an actual memory search key comprises enabling generation of first memory search key portions of the program code based on a valid state of the validity feedback and denying generation of second memory search key portions of the program code based on an invalid state of the validity feedback.

41. The method of claim 40, wherein the validity feedback is continuously updated as a user graphically proposes modifications to the visual representation of the memory search key.

42. The method of claim 34, wherein the programmable circuit is an ingress processor implemented on a line card of a network router.

43. The method of claim 42, wherein the ingress processor comprises at least a parsing module and an editing module.

44. The method of claim 34, wherein the programmable circuit is an egress processor implemented on a line card of a network router.

45. The method of claim 34, wherein the programmable circuit is a fabric interface processor implemented on a network router.

46. The method of claim 34, further comprising providing real time validity feedback based on an underlying rules model of the programmable circuit, and wherein automatically generating program code comprises enabling generation of first portions of the program code based on a valid state of the validity feedback and denying generation of second portions of the program code based on an invalid state of the validity feedback.

47. The method of claim 46, wherein the validity feedback is continuously updated as a user graphically proposes modifications to the one or more data fields associated with the visual representation of the expected data protocol format.

48. A graphical programming tool for generating program code operable on a programmable circuit having a circuit programming interface, comprising:

a graphical user interface to display a visual representation of at least one expected data protocol format for data packets that will be input to the programmable circuit, and to allow a user to graphically edit one or more data fields associated with the visual representation of the expected data protocol format to produce a visual representation of a desired data protocol format for transformed data packets that are to be output from the programmable circuit;

a processor configured to automatically generate program code for use by the programmable circuit to transform the data packets that are received at the programmable circuit to the transformed data packets that are output from the programmable circuit, wherein a resulting transformation of the data packets at the programmable circuit corresponds to the graphical transformation effected via the graphical user interface; and a programming tool interface coupled to the circuit programming interface to provide the generated program code to the programmable circuit.

49. A graphical programming tool for generating program code operable on a programmable circuit, comprising:

means for graphically defining at least one type of input data unit that is expected to be received at the programmable circuit;

means for presenting a visual representation of an input data format corresponding to the defined type of input data unit;

means for graphically manipulating the visual representation of the input data format to graphically transform the input data format to a visual representation of a desired output data format of output data units to be output from the programmable circuit; and means for automatically generating program code for directing the programmable circuit at run-time deployment to transform actual input data units of the defined type of input data units to actual output data units having the desired output data format in a manner corresponding to the graphical transformation of the visual representations input data format to the desired output data format.

50. A computer-readable medium having computer-executable instructions for generating program code operable on a programmable circuit, the computer-executable instructions performing steps comprising:

displaying a visual representation of at least one expected data protocol format for data packets that will be input to the programmable circuit;

providing a graphical user interface to allow a user to graphically edit one or more data fields associated with the visual representation of the expected data protocol format to produce a visual representation of a desired data protocol format for transformed data packets that are to be output from the programmable circuit; and automatically generating program code for use by the programmable circuit to transform the data packets that are received at the programmable circuit to the transformed data packets that are output from the programmable circuit, wherein a resulting transformation of the data packets at the programmable circuit corresponds to the graphical transformation effected via the graphical user interface.

* * * * *